(12) United States Patent  
Hwang

(10) Patent No.: US 8,514,619 B2
(45) Date of Patent: Aug. 20, 2013

(54) MAGNETIC MEMORY DEVICES AND METHODS OF OPERATING THE SAME

(75) Inventor: In-jun Hwang, Yongin-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 286 days.

(21) Appl. No.: 12/923,129

(22) Filed: Sep. 3, 2010

(65) Prior Publication Data

US 2011/0149649 A1 Jun. 23, 2011

(30) Foreign Application Priority Data

Dec. 21, 2009 (KR) .................. 10-2009-0128345

(51) Int. Cl.
*G11C 11/15* (2006.01)

(52) U.S. Cl.
USPC ........... 365/173; 365/148; 365/158; 365/171; 977/933; 977/935

(58) Field of Classification Search
USPC .......... 365/48, 55, 62, 66, 74, 78, 80–93, 365/100, 130, 131, 148, 158, 171–173, 209, 365/213, 225.5, 230.07, 232, 243.5; 216/22; 257/421, E21.665; 438/3; 428/810–816, 428/817–825.1, 826; 977/933–935
See application file for complete search history.

(56) References Cited

U.S. PATENT DOCUMENTS

| 4,041,447 | A | * | 8/1977 | Feuersanger et al. | ........... 365/40 |
| 6,781,871 | B2 | | 8/2004 | Park et al. | |
| 6,834,005 | B1 | | 12/2004 | Parkin | |
| 7,525,862 | B1 | | 4/2009 | Sun et al. | |
| 2008/0204946 | A1 | | 8/2008 | Ochiai et al. | |
| 2009/0109739 | A1 | | 4/2009 | Ranjan et al. | |
| 2009/0141541 | A1 | | 6/2009 | Covington | |
| 2009/0180312 | A1 | | 7/2009 | Miura et al. | |
| 2011/0260273 | A1 | * | 10/2011 | Fukami et al. | ................ 257/421 |
| 2011/0267879 | A1 | * | 11/2011 | Nagahara et al. | ............. 365/171 |

FOREIGN PATENT DOCUMENTS

JP   2007273495 A   10/2007

* cited by examiner

*Primary Examiner* — Harry W Byrne
(74) *Attorney, Agent, or Firm* — Harness, Dickey & Pierce, P.L.C.

(57) ABSTRACT

A magnetic memory device includes: a free layer for storing information; and a reference layer disposed on a first surface of the free layer. The reference layer includes at least two magnetic domains and a magnetic domain wall between the at least two magnetic domains. The reference layer extends past both ends of the free layer. The magnetic memory device further includes a switching element connected to a second surface of the free layer. Another magnetic memory device includes: a first reference layer having a first magnetic domain wall; a second reference layer having a second magnetic domain wall; and a memory structure between the first and second reference layers. The memory structure includes: a first free layer adjacent to the first reference layer; a second free layer adjacent to the second reference layer; and a switching element between the first and second free layers.

15 Claims, 22 Drawing Sheets

<STATE 1>

<STATE 2>

<STATE 3>

<STATE 4>

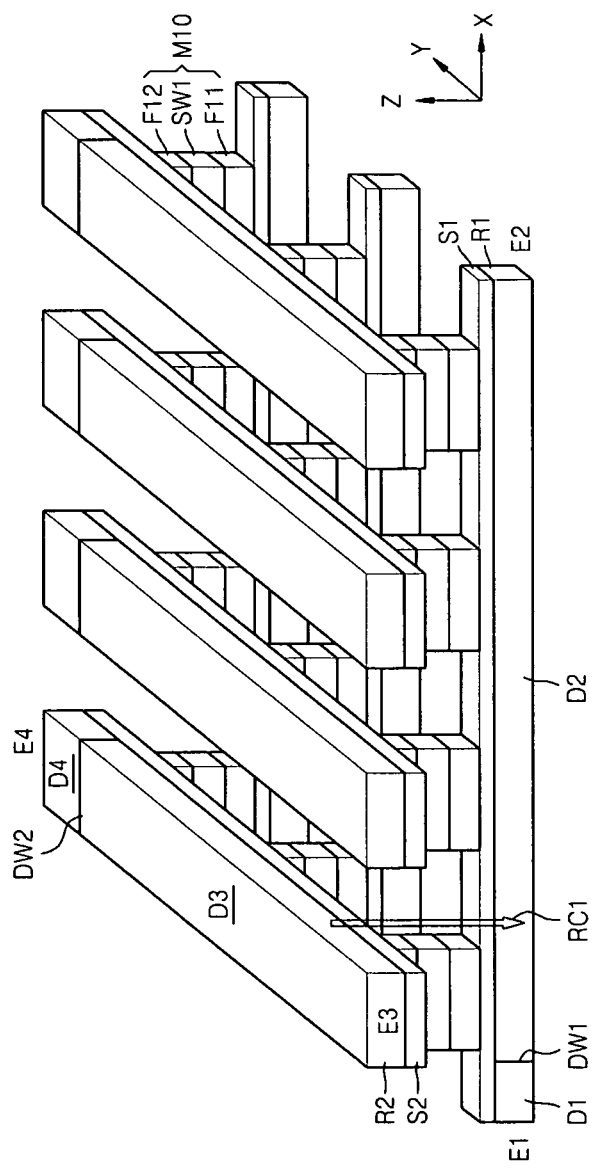

MAGNETIC MEMORY DEVICES AND METHODS OF OPERATING THE SAME

CROSS-REFERENCE TO RELATED APPLICATION(S)

This application claims priority under 35 U.S.C. §119 to Korean Patent Application No. 10-2009-0128345, filed on Dec. 21, 2009, in the Korean Intellectual Property Office, the entire contents of which is incorporated herein by reference.

BACKGROUND

1. Field

Example embodiments relate to magnetic memory devices and methods of operating the same.

2. Description of the Related Art

Non-volatile information storage devices retain recorded information even when power is cut off. Conventional non-volatile information storage devices include hard disk drives (HDDs), non-volatile random access memories (RAMs), etc.

In general, HDDs wear down due to a rotating mechanic device included in the HDD and may possibly experience operational failures, thereby causing relatively low reliability.

A representative example of a non-volatile RAM is flash memory. Although flash memory does not use a rotating mechanical device, flash memory has relatively low reading and writing speeds, relatively short lifetimes, and smaller storage capacities than HDDs. Also, flash memory has relatively high manufacturing costs.

Another type of information storage device uses magnetic domain wall movement. A magnetic domain is a minute magnetic region of a ferromagnetic material in which magnetic moments are arranged in a specific direction. A magnetic domain wall is a border region between magnetic domains having different magnetization directions. Magnetic domains and magnetic domain walls are moved by supplying a current to a magnetic track. It is expected that an information storage device which has a relatively large storage capacity, but does not use a rotating mechanical device can be realized by using the movement of the magnetic domain and the magnetic domain wall.

SUMMARY

Example embodiments provide magnetic memory devices having a higher degree of integration and in which a read/write operation may be performed more easily. Example embodiments also provide methods of operating magnetic memory devices.

Additional aspects are set forth in the description which follows and are apparent from the description, or may be learned by practice of the presented example embodiments.

At least one example embodiment provides a magnetic memory device. According to at least this example embodiment, the magnetic memory device includes: a first free layer configured to store information; a first reference layer disposed on a first surface of the first free layer and extending past both ends of the first free layer; and a first switching element disposed on a second surface of the first free layer. The first reference layer includes at least two magnetic domains and a first magnetic domain wall between the at least two magnetic domains.

According to at least some example embodiments, the magnetic memory device may further include a non-magnetic separation layer disposed between the first free layer and the first reference layer.

A first electrode may be disposed as a wire above the first reference layer to intersect the first reference layer. The first free layer and the first switching element may be stacked sequentially at an area where the first reference layer and the first electrode intersect each other.

The first electrode may be a second reference layer including a second magnetic domain wall. In this example, a second free layer and a second switching element may be stacked sequentially on the second reference layer.

The magnetic memory device may further include a second reference layer disposed as a wire above the first electrode to intersect the first electrode. The second reference layer may include a second magnetic domain wall. In this example, a second switching element and a second free layer may be stacked sequentially at an area where the first electrode and the second reference layer intersect each other.

The magnetic memory device may have a multi-layer cross point array structure.

At least one other example embodiment provides a method of operating a magnetic memory device including: a first free layer configured to store information; a first reference layer disposed on a first surface of the first free layer and extending past both ends of the first free layer, wherein the first reference layer includes at least two magnetic domains and a first magnetic domain wall between the at least two magnetic domains; and a first switching element disposed on a second surface of the first free layer. According to at least this example embodiment, the method includes: positioning one of the at least two magnetic domains on a region of the first reference layer that corresponds to the first free layer; and supplying a write current between the first free layer and the first reference layer. Information to be written to the first free layer by the write current is determined according to which of the at least two magnetic domains of the first reference layer corresponds to the first free layer.

According to at least some example embodiments, the method may further include: supplying one of a read current and an erase current between the first free layer and the first reference layer.

At least one other example embodiment provides a magnetic memory device including: a first reference layer having the form of a wire and including at least two first magnetic domains and a first magnetic domain wall between the at least two first magnetic domains; a second reference layer disposed as a wire to be spaced apart from the first reference layer, wherein the second reference layer includes at least two second magnetic domains and a second magnetic domain wall between the at least two second magnetic domains; and a first memory structure disposed between the first and second reference layers. The first memory structure includes at least two free layers as information storage elements.

According to at least some example embodiments, the first memory structure may include: a first free layer disposed adjacent to the first reference layer; a second free layer disposed adjacent to the second reference layer; and a first switching element disposed between the first and second free layers.

The magnetic memory device may further include: a first separation layer disposed between the first reference layer and the first free layer; and a second separation layer disposed between the second reference layer and the second free layer.

The thicknesses of the first and second separation layers may be the same or different.

According to at least some example embodiments, a plurality of the first reference layers may be disposed in parallel, a plurality of the second reference layers may be disposed in parallel to intersect the plurality of the first reference layers, and the first memory structure may be disposed at areas where the first and second reference layers intersect one another.

The magnetic memory device may further include a plurality of third reference layers disposed above the plurality of the second reference layers to intersect the plurality of the second reference layers. Each of the plurality of third reference layers may include at least two third magnetic domains and a third magnetic domain wall between the at least two third magnetic domains. The magnetic memory device may further include a plurality of second memory structures disposed at areas where the second and third reference layers intersect one another. Each of the plurality of second memory structures including at least two free layers as information storage elements.

Each of the second memory structures may include: a third free layer disposed adjacent to the second reference layer; a fourth free layer disposed adjacent to the third reference layer; and a second switching element disposed between the third and fourth free layers.

At least one other example embodiment provides a method of operating a magnetic memory device including: a first reference layer having the form of a wire and including at least two first magnetic domains and a first magnetic domain wall between the at least two first magnetic domains; a second reference layer disposed as a wire to be spaced apart from the first reference layer, wherein the second reference layer includes at least two second magnetic domains and a second magnetic domain wall between the at least two second magnetic domains; and a first memory structure disposed between the first and second reference layers, wherein the first memory structure includes at least two free layers as information storage elements. According to at least this example embodiment, the method includes: supplying a write current from the first or second reference layer to the other of the first and second reference layers through the first memory structure.

According to at least some example embodiments, information that is to be written to the first memory structure by the write current may vary according to which of the at least two magnetic domains in each of the first and second reference layers corresponds to the first memory structure.

Before and/or after supplying of the write current, the method may further include: moving the magnetic domain wall within at least one of the first and second reference layers past a region on which the first memory structure is disposed.

The method may further include supplying a read current or an erase current from the first or second reference layer to the other of the first and second reference layers through the first memory structure.

Before and/or after the supplying of the read current or the erase current, the method may further include: moving the magnetic domain wall within at least one of the first and second reference layers past a region on which the first memory structure is disposed.

The switching element may be a one-way switching element.

A plurality of the first reference layers may be disposed in parallel. A plurality of the second reference layers may be disposed in parallel to intersect the plurality of the first reference layers. The first memory structure may be disposed at areas where the first and second reference layers intersect one another.

A first current may be supplied between at least one selected from among the plurality of first reference layers and at least one selected from among the plurality of second reference layers. The first current may be the write current, the read current, or the erase current.

Before and/or after supplying the first current, magnetic domain wall movement may be performed on least one selected from among the plurality of first reference layers and/or at least one selected from among the plurality of second reference layers.

BRIEF DESCRIPTION OF THE DRAWINGS

These and/or other aspects will become apparent and more readily appreciated from the following description of example embodiments, taken in conjunction with the accompanying drawings in which:

FIGS. 19A to 19D are perspective views illustrating a method of operating the magnetic memory device of FIG. 17 according to an example embodiment.

DETAILED DESCRIPTION

Figure 1:
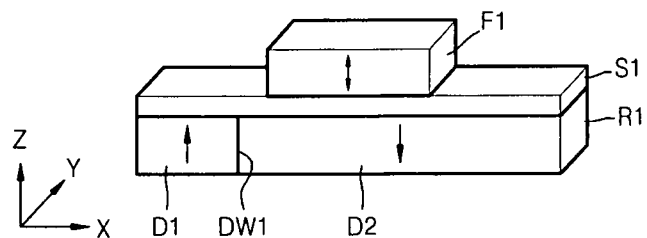
FIG. 1 is a perspective view illustrating a basic structure of a magnetic memory device according to an example embodiment.

Various example embodiments will now be described more fully with reference to the accompanying drawings in which example embodiments are shown.

When an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

Although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the drawings, the thicknesses of layers and regions are exaggerated for clarity. Like reference numerals in the drawings denote like elements.

Hereinafter, example embodiments of magnetic memory devices and methods of operating the same will be described in detail with reference to the accompanying drawings.

FIG. 1 is a perspective view illustrating a basic structure of a magnetic memory device according to an example embodiment.

Referring to FIG. 1, a reference layer R1 is disposed in the form of a wire along a given, desired or predetermined direction (e.g., an X-axis direction). The reference layer R1 may be a magnetic layer. For example, the reference layer R1 may be formed of a magnetic material including at least one magnetic material selected from among Co, Fe, and Ni. The magnetic material may further include an element other than Co, Fe, and Ni. The reference layer R1 includes a magnetic domain wall DW1. The magnetic domain wall DW1 is a border region between first and second magnetic domains D1 and D2, which are magnetized in opposite directions.

The reference layer R1 may have perpendicular magnetic anisotropy. For example, the reference layer R1 may have a magnetic easy axis that is parallel or substantially parallel to a Z-axis. In this case, as illustrated in FIG. 1, the first magnetic domain D1 is magnetized in the Z-axis and the second magnetic domain D2 is magnetized in a direction opposite to the magnetization direction (the Z-axis direction) of the first magnetic domain D1. Arrows indicated in the respective first and second magnetic domains D1 and D2 denote the respective magnetization directions thereof. The magnetization directions of the respective first and second magnetic domains D1 and D2 may be switched from each other.

The reference layer R1 may have in-plane magnetic anisotropy in which the reference layer R1 may have a magnetic easy axis perpendicular or substantially perpendicular to the Z-axis. In this case, the directions of magnetization of the first and second magnetic domains D1 and D2 may be perpendicular or substantially perpendicular to the Z-axis.

The magnetic domain wall DW1 may be moved by supplying a current between both ends of the reference layer R1. The direction of movement of the magnetic domain wall DW1 is determined by a direction in which the current is supplied. The magnetic domain wall DW1 may be moved in a direction along which electrons flow. Because the direction in which the current flows is opposite to the direction in which the electrons flow, the magnetic domain wall DW1 is moved in a direction opposite to the direction of the current flow. Movement of the magnetic domain wall DW1 means that the first or second magnetic domain D1 or D2 expands while the other contracts.

Still referring to FIG. 1, a free layer F1 for storing information is disposed on the reference layer R1. The free layer F1 is shorter in size than the reference layer R1 and may correspond to a given, desired or predetermined region of the reference layer R1 except for both ends thereof. For example, the reference layer R1 may extend over both ends of the free layer F1. The magnetization direction of the free layer F1 may be changed by external energy supplied to the free layer F1. For example, as illustrated in FIG. 1, the magnetization direction of the free layer F1 may be switched from the Z-axis direction to the inverse Z-axis direction and vice versa. If the reference layer R1 has a magnetic easy axis perpendicular to the Z-axis, then the magnetization direction of the free layer F1 may also be perpendicular to the Z-axis. The free layer F1 may be formed of a magnetic material that is used as a material of a free layer in a general or conventional magnetic device.

A separation layer S1 is disposed between the reference layer R1 and the free layer F1. The separation layer S1 may be a non-magnetic layer. For example, the separation layer S1 may be an insulating layer formed of, for example, an Mg oxide, a Cu oxide, or an Al oxide. In this case, the separation layer S1 has a thickness that allows tunneling of electrons. In some cases, the separation layer S1 may be formed of a conductive material. The separation layer S1 may be formed to cover the entire top surface of the reference layer R1 as shown in FIG. 1. Alternatively, the separation layer S1 may have a length equal or substantially equal to that of a bottom surface of the free layer F1.

Although not shown in FIG. 1, the free layer F1 may be connected to a given, desired or predetermined switching element. The switching element may be, for example, a diode or a transistor, but is not limited thereto.

FIGS. 2A to 2D are perspective views illustrating a method of performing a write operation using the magnetic memory device of FIG. 1 according to an example embodiment. In FIGS. 2A to 2D, reference numerals E1 and E2 denote first and second ends of a reference layer R1. In the reference layer R1, one end belonging to a first magnetic domain D1 is referred to as the 'first end E1' and another end belonging to the second magnetic domain D2 is referred to as the 'second end E2'.

Figure 2A:
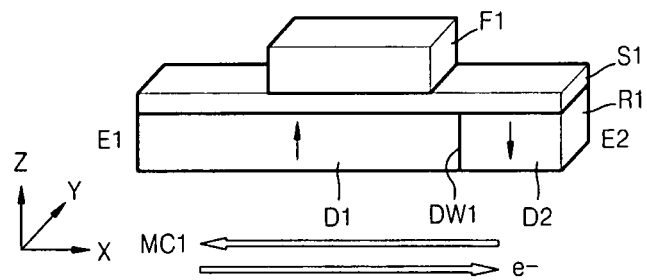
FIGS. 2A to 2D are perspective views illustrating a method of performing a write operation by using the magnetic memory device of FIG. 1 according to an example embodiment.

Referring to FIG. 2A, a magnetic domain wall DW1 is moved adjacent to the second end E2 by supplying a first movement current MC1 to the reference layer R1 from the second end E2 to the first end E1. In this case, electrons e– flow from the first end E1 to the second end E2, and the magnetic domain wall DW1 moves in a direction in which the electrons e– flow. The length of the movement of the magnetic domain wall DW1 may be controlled by the intensity of the first movement current MC1 and a time duration in which the first movement current MC1 is supplied. The magnetic domain wall DW1 is moved past the free layer F1, so that the first magnetic domain D1 expands to cover the free layer F1. In this case, the first magnetic domain D1 corresponds to the free layer F1.

Figure 2B:
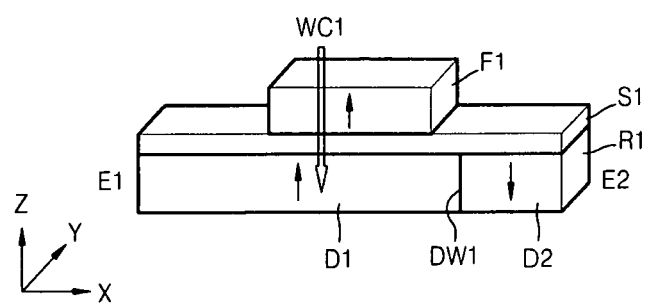

Referring to FIG. 2B, the free layer F1 is magnetized in the magnetization direction of the first magnetic domain D1 by supplying a first write current WC1 from the free layer F1 to the reference layer R1. The first write current WC1 may be supplied from the free layer F1 to the first end E1. In this case, electrons flow from the first end E1 to the free layer F1, and thus, the magnetization direction of the first magnetic domain D1 is transcribed or transferred to the free layer F1. For example, the electrons flowing to the free layer F1 through the first magnetic domain D1 have the same spin direction as that of the first magnetic domain D1, and apply spin torque to the free layer F1. By the spin torque, the free layer F1 is magnetized in the same direction as that of the first magnetic domain D1.

Figure 2C:
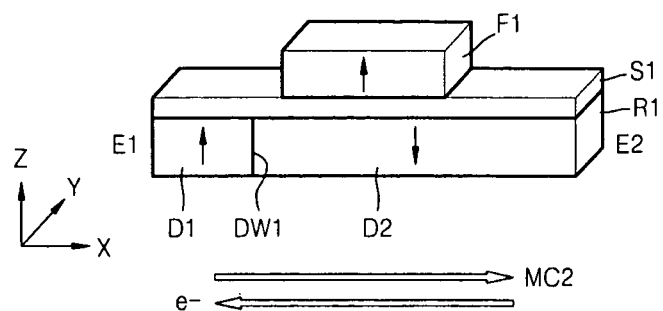

Referring to FIG. 2C, a second movement current MC2 is supplied from the first end E1 to the second end E2 of the reference layer R1. In this case, the magnetic domain wall DW1 moves adjacent to the first end E1 because the electrons e– flow from the second end E2 to the first end E1. The magnetic domain wall DW1 is moved past the free layer F1, so that the second magnetic domain D2 expands to cover the free layer F1. In this case, the second magnetic domain D2 corresponds to the free layer F1.

Figure 2D:
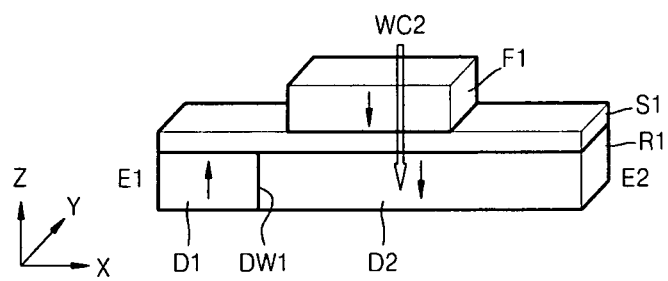

Referring to FIG. 2D, the magnetization direction of the free layer F1 is changed to be the same as the magnetization direction of the second magnetic domain D2 by supplying a second write current WC2 from the free layer F1 to the reference layer R1. The second write current WC2 is supplied from the free layer F1 to the second end E2. Then, electrons flow from the second end E2 to the free layer F1, and the magnetization direction of the second magnetic domain D2 is transcribed or transferred onto the free layer F1.

As described above with reference to FIGS. 2A to 2D, if the magnetic domain wall DW1 is moved, then a magnetic domain corresponding to the free layer F1 is replaced with another magnetic domain. Information written to the free layer F1 may vary according to the magnetic domain corresponding to the free layer F1. In other words, the information to be written in the free layer F1 by the write current may be determined according to whether the magnetic domain wall DW1 is located at one side or another side of the free layer F1. The write operation performed by supplying the first or second write current WC1 or WC2 uses a spin transfer torque. For example, electrons that have the same spin direction as that of the first or second magnetic domain D1 or D2 corresponding to the free layer F1 flow into the free layer F1, and thus, the free layer F1 may be magnetized in the same magnetization direction of the first or second magnetic domain D1 or D2 corresponding to the free layer F1. Accordingly, in the above example embodiments, information may be written by using movement of a magnetic domain wall and a spin transfer torque.

Both the first and second write currents WC1 and WC2 are supplied from the free layer F1 to the reference layer R. For example, the free layer F1 may be magnetized in a first direction or in a direction opposite to the first direction (second direction) by supplying the first or second write current WC1 or WC2 from the free layer F1 to the reference layer R1. If current supplied to magnetize the free layer F1 in the first direction and current supplied to magnetize the free layer F1 in the second direction flow in opposite directions (e.g., if current should be supplied from the free layer F1 to the reference layer R1 in order to magnetize the free layer F1 in the first direction and current should be supplied from the reference layer R1 to the free layer F1 in order to magnetize the free layer F1 in the second direction), then it may be relatively difficult to operate a magnetic memory device and a structure of the magnetic memory device may be relatively complicated. However, in according to at least some example embodiments, the free layer F1 may be magnetized in the first or second direction by supplying the write current WC1 or WC2 from the free layer F1 to the reference layer R1, thereby more easily operating the magnetic memory device and simplifying the structure of the magnetic memory device.

In addition, in order to suppress and/or prevent the magnetic domain wall DW1 from moving outside the reference layer R1 during movement of the magnetic domain wall DW1 as described above with reference to FIGS. 2A and 2C, an element (or site) for pinning the magnetic domain wall DW1 may be provided (or introduced) at (or around) ends E1 and E2 of the reference layer R1. For example, a notch may be formed around both the ends E1 and E2 of the reference layer R1 so that the magnetic domain wall DW1 may be pinned by the notch. Otherwise, if the widths of the ends E1 and E2 of the reference layer R1 are increased, then the density of current decreases in the ends E1 and E2, and thus, the magnetic domain wall DW1 may be moved more stably within the reference layer R1 while not being moved outside the ends E1 and E2.

Example methods of performing a read operation using the magnetic memory device of FIG. 1 will now be described briefly with reference to FIGS. 2B to 2D.

Referring to FIG. 2B, in a state in which the free layer F1 is magnetized in the same direction as the first magnetic domain D1, a first read current is supplied between the free layer F1 and the reference layer R1 to read information from the free layer F1. The first read current may be supplied from the free layer F1 to the first end E1, but may be supplied from the free layer F1 to the second end E2 in some cases.

Referring to FIG. 2D, in a state in which the free layer F1 is magnetized in the same direction as the second magnetic domain D2, a second read current is be supplied between the free layer F1 and the reference layer R1 to read information from the free layer F1. The second read current may be supplied from the free layer F1 to the second end E2, but in some cases may also be supplied from the free layer F1 to the first end E1.

As illustrated in FIG. 2C, the information may be read from the free layer F1 when the magnetization direction of the free layer F1 is opposite to the magnetization direction of the reference layer R1 corresponding to the free layer F1. Also, the information may be read from the free layer F1 after moving the magnetic domain wall DW1 toward the second end E2 so as to pass the free layer F1 as shown in FIG. 2D.

As described above, a read operation may be performed by supplying a read current from the free layer F1 to the reference layer R1. An electric resistance between the free layer F1 and the reference layer R1 may vary according to whether the magnetization direction of the free layer F1 is the same as or opposite to that of the reference layer R1 corresponding to the free layer F1. Accordingly, information written to the free layer F1 may be identified (discriminated). The intensity of the read current may be less than those of the first and second write currents WC1 and WC2. Thus, even if the read current is supplied, the magnetization direction of the free layer F1 does not change and the location of the magnetic domain wall DW1 also does not change.

The method of performing the write operation illustrated in FIG. 2D may be considered, for example, an erase operation. That is, the method of FIG. 2D may be regarded as a process of writing information to the free layer F1, but may also be regarded as a process of erasing information from the free layer F1. The magnetic domain wall movement described above with reference to FIGS. 2A and 2C may be performed before and/or after the erase operation.

As described above, a write operation, a read operation, and/or an erase operation may be performed by supplying a current from the free layer F1 to the reference layer R1. In addition, a current for moving the magnetic domain wall DW1 may be selectively supplied between the first and second ends E1 and E2 of the reference layer R1 if needed. Accordingly, in at least some example embodiments, a magnetic memory device may be operated more easily and the structure of the magnetic memory device may be simplified.

In general, a magnetic tunnel junction (MTJ) device uses a pinned layer. In this case, an anti-ferromagnetic layer or a synthetic anti-ferromagnetic (SAF) element is needed to fix a magnetization direction of the pinned layer, thereby complicating the structure of a memory cell, increasing the size of the memory cell and lowering thermal stability. However, in according to at least some example embodiments, the anti-ferromagnetic layer or the SAF device need not be installed because the reference layer R1 in which the magnetic domain wall DW1 is moved is used. Accordingly, according to at least some example embodiments, the structure of a memory cell may be simplified and thermal stability may be improved.

Also, in the case of a general information storage device that uses magnetic domain wall movement, a magnetic track having a plurality of magnetic domains and a plurality of magnetic domain walls is used as an information storage element and information is written to or read from the plurality of magnetic domains while dragging the magnetic domains and the magnetic domain walls within the magnetic track. In such an information storage device, it is relatively difficult to precisely control the location of the plurality of magnetic domains and the magnetic domain walls. However, according to at least some example embodiments, the free layer F1 corresponding to the reference layer R1 is used as an information storage element, and the location of the information storage element (e.g., the free layer F1) is fixed. Also, relatively high-precision adjustment may not be needed to control the location of the single magnetic domain wall DW1 in the reference layer R1. Thus, example embodiments provide a more easily controllable location of the plurality of magnetic domains and the magnetic domain walls.

Figure 3:
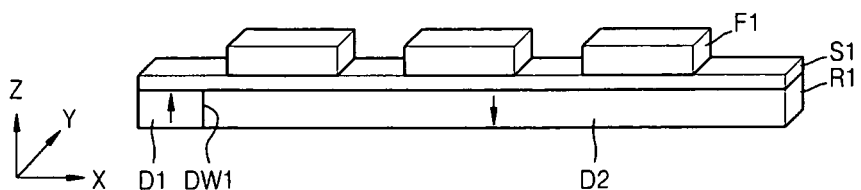
FIG. 3 is a perspective view of a magnetic memory device according to another example embodiment.

FIG. 3 is a perspective view of a modified example of the magnetic memory device of FIG. 1 according to an example embodiment.

Referring to FIG. 3, a plurality of free layers F1 are disposed on a reference layer R1 that extends in the form of a wire. The plurality of free layers F1 are disposed at equal or substantially equal intervals on the reference layer R1, except for both ends of the reference layer R1. A separation layer S1 is disposed between the reference layer R1 and the plurality of free layers F1.

FIGS. 4A to 4D are perspective views illustrating a method of performing a write operation using the magnetic memory device of FIG. 3 according to an example embodiment.

Figure 4A:
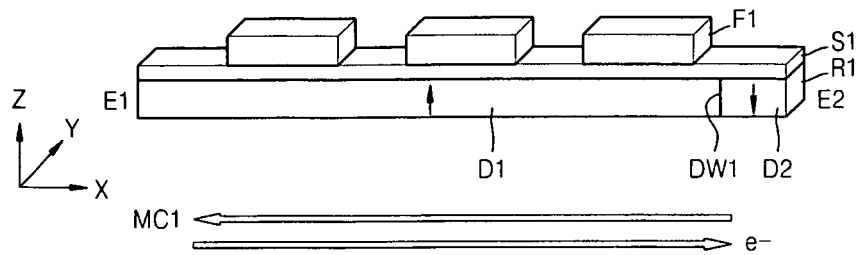
FIGS. 4A to 4E are perspective views illustrating methods of operating the magnetic memory device of FIG. 3 according to example embodiments.

Referring to FIG. 4A, a first movement current MC1 is supplied from a second end E2 to a first end E1 of the reference layer R1 so that a magnetic domain wall DW1 moves adjacent to the second end E2. In this case, electrons e− flow from the first end E1 to the second end E2 and the magnetic domain wall DW1 moves along the direction in which the electrons e− flow. The magnetic domain wall DW1 moves past the plurality of free layers F1.

Figure 4B:
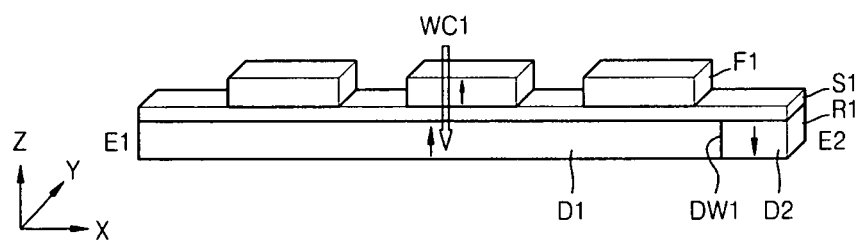

Referring to FIG. 4B, a first write current WC1 is supplied from at least one selected from among the plurality of free layers F1 to the reference layer R1 so that the at least one free layer F1 is magnetized in a magnetization direction of a first magnetic domain D1.

Figure 4C:
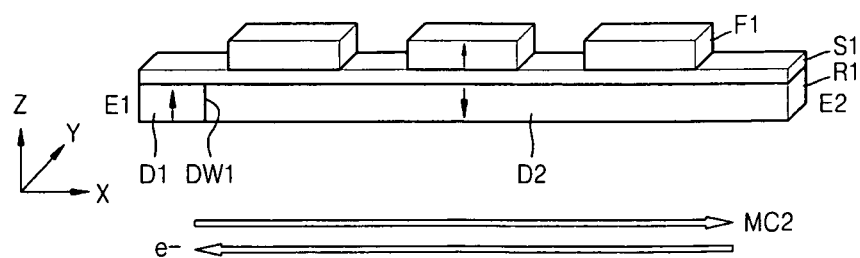

Referring to FIG. 4C, a second movement current MC2 is supplied from the first end E1 to the second end E2 of the reference layer R1. In this case, the electrons e− flow from the second end E2 to the first end E1, and thus, the magnetic domain wall DW1 moves adjacent to the first end E1. The magnetic domain wall DW1 moves past the plurality of free layers F1.

Figure 4D:
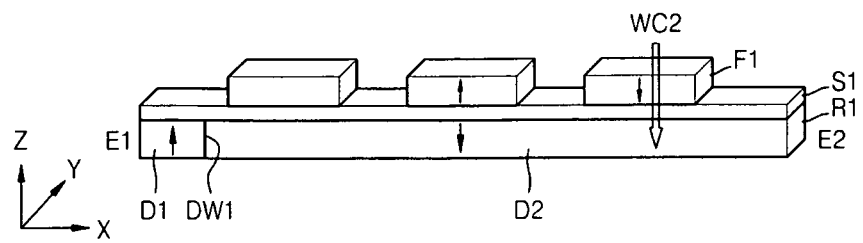

Referring to FIG. 4D, a second write current WC2 is supplied from at least one selected from among the plurality of free layers F1 to the reference layer R1 so that the at least one free layer F1 is magnetized in a magnetization direction of a second magnetic domain D2. Here, the at least one free layer F1 is not the same as the at least one free layer F1 selected in the operation of FIG. 4B.

Thereafter, although not shown, the magnetic domain wall DW1 may move adjacent to the second end E2 by supplying a movement current from the second end E2 to the first end E1. The magnetic domain wall DW1 may move past the plurality of free layers F1. This movement of the magnetic domain wall DW1 is optional and may be considered as a preliminary to a read operation.

Figure 4E:
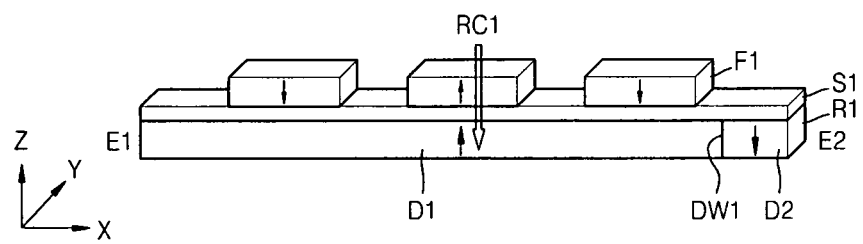

FIG. 4E is a perspective view illustrating a method of performing a read operation using the magnetic memory device of FIG. 3 according to an example embodiment.

Referring to FIG. 4E, a read current RC1 is supplied from one selected from among the plurality of free layers F1 to the reference layer R1 while the plurality of free layers F1 are magnetized in a given, desired or predetermined direction and the magnetic domain wall DW1 is located near the second end E2. As such, information is read from the selected free layer F1. The read current RC1 may be supplied from the selected free layer F1 to the first end E1, but may be supplied from the selected free layer F1 to the second end E2 in some cases. The magnetic domain wall DW1 may be moved in the reference layer R1 before and/or after performing the read operation. In this case, the magnetic domain wall DW1 may be moved past the plurality of free layers F1.

Figure 5A:
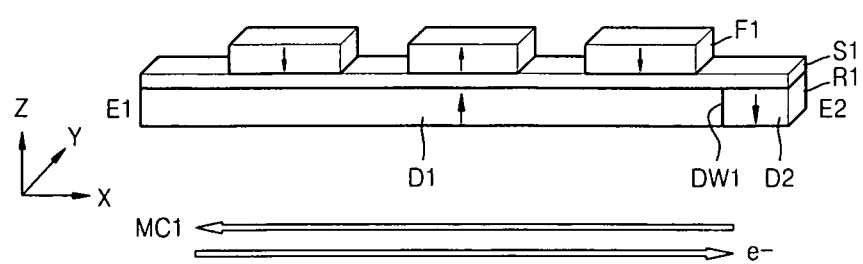
FIGS. 5A to 5E are perspective views illustrating methods of operating the magnetic memory device of FIG. 3 according to other example embodiments.
Figure 5B:
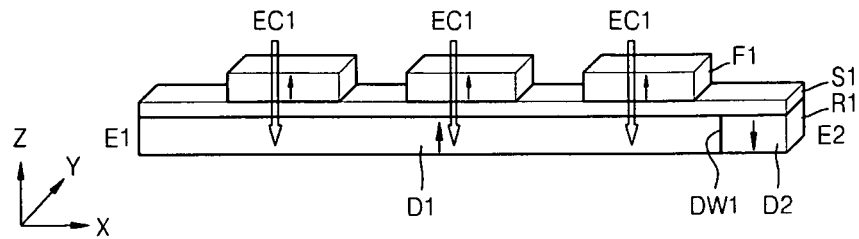
Figure 5C:
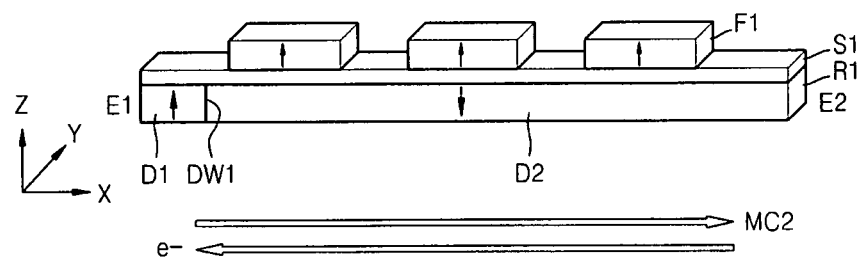

FIGS. 5A to 5C are perspective views illustrating a method of performing an erase method using the magnetic memory device of FIG. 3 according to an example embodiment.

Referring to FIG. 5A, the magnetic domain wall DW1 moves adjacent to the second end E2 of the reference layer R1 by supplying the first movement current MC1 from the second end E2 to the first end E1 while the plurality of free layers F1 are magnetized in a given, desired or predetermined direction. The magnetic domain wall DW1 is moved past the plurality of free layers F1.

Referring to FIG. 5B, all or substantially all of the plurality of free layers F1 are magnetized in the magnetization direction of the first magnetic domain D1 by supplying an erase current EC1 from all or substantially all of the plurality of free layers F1 to the reference layer R1. This operation may be considered an erase operation, but may also be considered as a write operation in which information corresponding to the first magnetic domain D1 is written to the plurality of free layers F1.

Referring to FIG. 5C, the magnetic domain wall DW1 moves adjacent to the first end E1 of the reference layer R1 by supplying the second movement current MC2 from the first end E1 to the second end E2. The magnetic domain wall DW1 moves past the plurality of free layers F1. The operation illustrated in FIG. 5C is optional and may be considered as preliminary to the write operation.

Figure 5D:
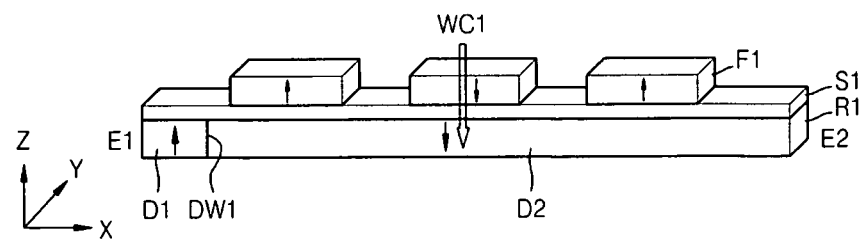

As illustrated in FIG. 5D, the write current WC1 is supplied from one selected from among the plurality of free layers F1 to the reference layer R1. The write current WC1 changes a magnetization direction of the selected free layer F1 to be the same as that of the second magnetic domain D2. In this case, the write current WC1 is supplied from the selected free layer F1 to the second end E2 of the reference layer R1.

Figure 5E:
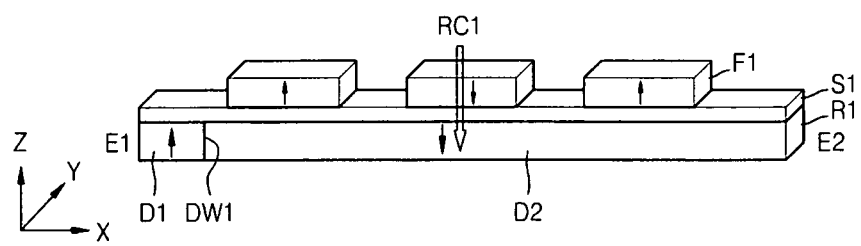

As illustrated in FIG. 5E, in order to read the information written in the operation illustrated in FIG. 5D, the read current RC1 is supplied from the selected free layer F1 to the reference layer R1. In this case, the read current RC1 is supplied from the selected free layer F1 to the second end E2 of the reference layer R1, but may be supplied from the selected free layer F1 to the first end E1 of the reference layer R1 in some cases.

Figure 6:
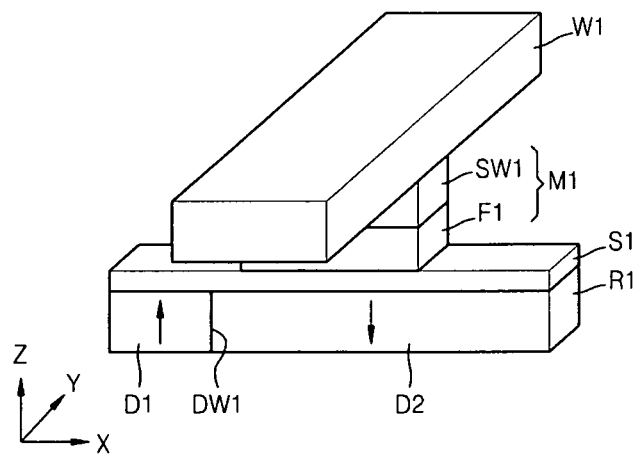
FIG. 6 is a perspective view of a basic structure of a magnetic memory device according to another example embodiment.

FIG. 6 is a perspective view of a basic structure of a magnetic memory device according to another example embodiment.

Referring to FIG. 6, a reference layer R1 is disposed in the form of a wire, wherein the reference layer R1 includes first and second magnetic domains D1 and D2, and a magnetic domain wall DW1 between the first and second magnetic domains D1 and D2. An electrode W1 is disposed in the form of a wire spaced apart from the reference layer R1. In FIG. 6, the reference layer R1 and the electrode W1 orthogonally intersect each other, but directions and shapes of the reference layer R1 and the electrode W1 may be changed in various ways. A memory structure M1 is disposed between the reference layer R1 and the electrode W1. The memory structure M1 includes a free layer F1 as an information storage element. The memory structure M1 further includes a switching element SW1 between the free layer F1 and the electrode W1. The switching element SW1 may be a one-way switching element such as a diode or other one-way switching element. In some cases, a two-way switching element may be used as the switching element SW1. Although not shown, the memory structure M1 may further include an intermediate electrode between the free layer F1 and the switching element SW1.

Still referring to FIG. 6, a separation layer S1 is disposed between the reference layer R1 and the memory structure M1 (e.g., between the reference layer R1 and the free layer F1). The separation layer S1 may be the same or substantially the same as the separation layer S1 illustrated in FIG. 1.

The magnetic memory device of FIG. 6 may be modified in various ways. For example, although not shown, the magnetic memory device of FIG. 6 may be turned upside down. In this case, a transistor formed on a substrate may used for the switching element SW1. One of a source and a drain of the transistor may be connected to the free layer F1, whereas the other may be connected to the electrode W1.

Figure 7A:
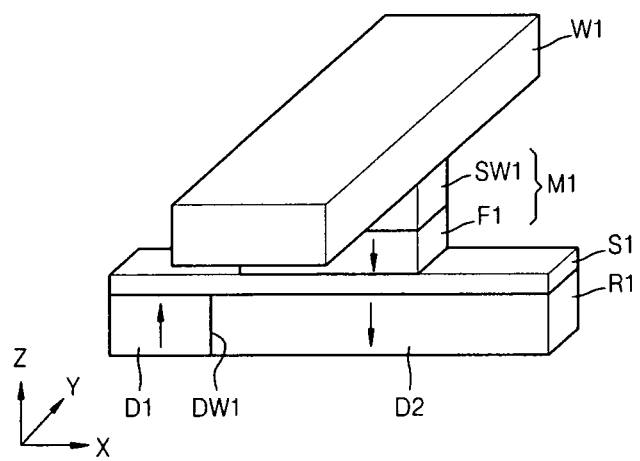
FIGS. 7A and 7B are perspective views illustrating two states that the magnetic memory device of FIG. 6 may have according to example embodiments.
Figure 7B:
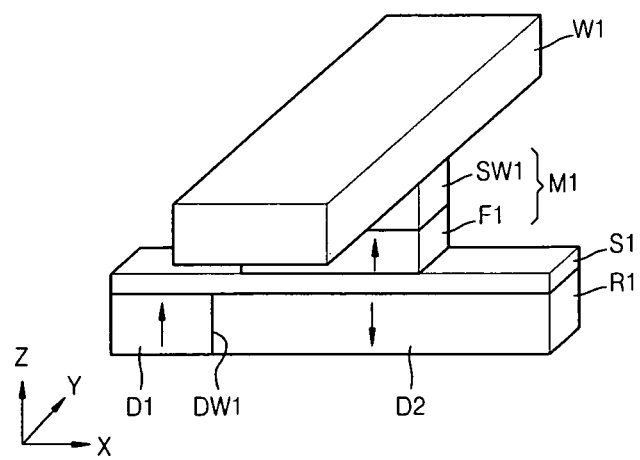

FIGS. 7A and 7B illustrate two example states that the magnetic memory device of FIG. 6 may have according to example embodiments.

Referring to FIG. 7A, the free layer F1 is magnetized in a direction in which a region of the reference layer R1 (the second magnetic domain D2) that corresponds to the free layer F1 is magnetized. In this case, the reference layer R1 and the free layer F1 are in a parallel state. A method of magnetizing the free layer F1 in a direction opposite to the Z-axis direction as illustrated in FIG. 7A may be the same or substantially the same as described above with reference to FIG. 2D.

Referring to FIG. 7B, the free layer F1 is magnetized in a direction opposite to a direction in which the region of the reference layer R1 (the second magnetic domain D2) that corresponds to the free layer F1 is magnetized. In this case, the reference layer R1 and the free layer F1 are in an anti-parallel state. A method of magnetizing the free layer F1 in the Z-axis direction as illustrated in FIG. 7B may be the same substantially the same as described above with reference to FIGS. 2A to 2C.

A write current may be supplied from the free layer F1 to the reference layer R1 both in a case where the free layer F1 is magnetized in the direction opposite to the Z-axis direction (FIG. 7A) and in a case where the free layer F1 is magnetized in the Z-axis direction (FIG. 7B). Accordingly, a one-way switching element may be used as the switching element SW1 to operate the magnetic memory device in a relatively simple manner, and the structure of the magnetic memory device may be simplified.

Figure 8:
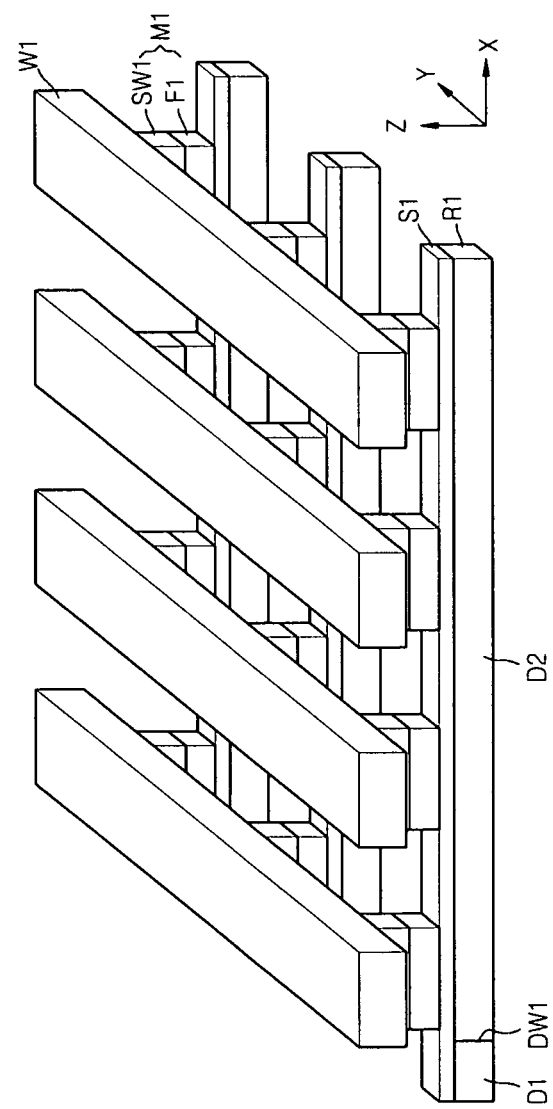
FIGS. 8 to 10 are perspective views illustrating magnetic memory devices having an array structure according to example embodiments.

FIG. 8 illustrates a magnetic memory device having an array structure according to an example embodiment.

Referring to FIG. 8, a plurality of reference layers R1 are arranged in the form of wires to be parallel or substantially parallel to one another. Each of the reference layers R1 includes first and second magnetic domains D1 and D2, and a magnetic domain wall DW1 between the first and second magnetic domains D1 and D2. A plurality of electrodes W1 are disposed above the plurality of reference layers R1 to be spaced apart from one another, and in the form of wires to be parallel or substantially parallel to one another. The reference layers R1 and the electrodes W1 intersect (e.g., orthogonally intersect) one another. A plurality of memory structures M1 are disposed at points or areas where the plurality of reference layers R1 and the plurality of electrodes W1 intersect one another, respectively. Each of the memory structures M1 has a structure in which a free layer F1 and a switching element SW1 are stacked sequentially. A separation layer S1 is disposed between the reference layers R1 and the free layers F1.

Figure 9:
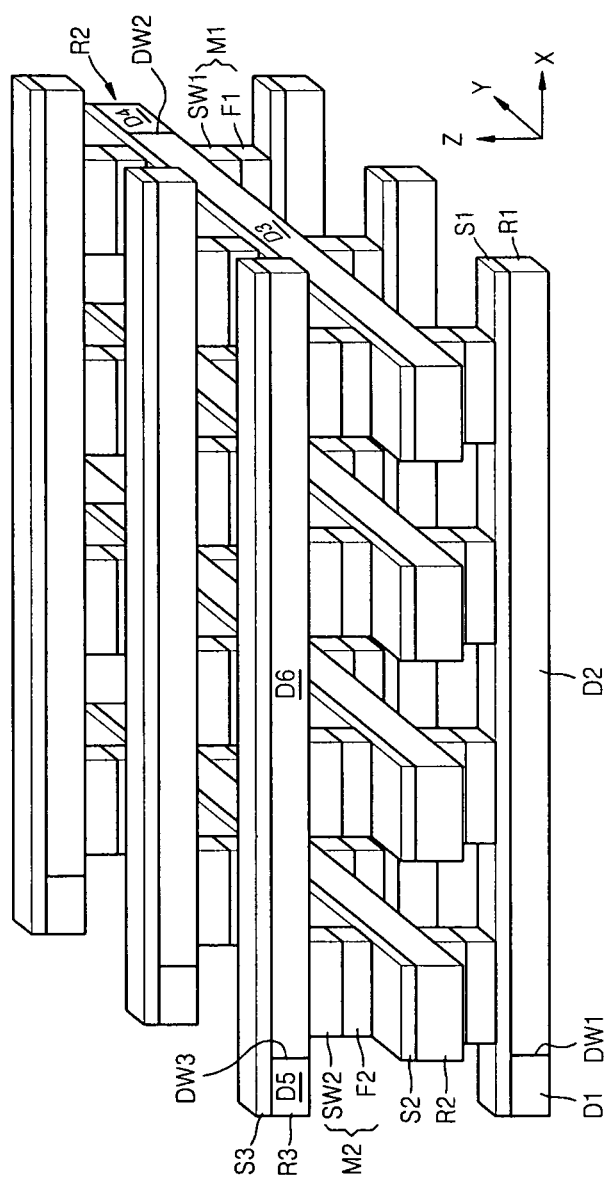

FIG. 9 illustrates a magnetic memory device having an array structure according to another example embodiment.

Referring to FIG. 9, a plurality of first reference layers R1 are disposed in the form of wires to be parallel or substantially parallel to one another. Each of the first reference layers R1 includes first and second magnetic domains D1 and D2, and a first magnetic domain wall DW1 between the first and second magnetic domains D1 and D2. A plurality of second reference layers R2 are disposed above the plurality of first reference layers R1 to be spaced apart from one another and in the form of wires to be parallel or substantially parallel to one another. Each of the second reference layers R2 includes third and fourth magnetic domains D3 and D4, and a second magnetic domain wall DW2 between the third and fourth magnetic domains D3 and D4. The first reference layers R1 and the second reference layers R2 intersect (e.g., orthogonally intersect) one another. A plurality of first memory structures M1 are disposed at points or areas where the first and second reference layers R1 and R2 intersect one another. The first memory structures M1 may be the same as the memory structures M1 of FIG. 8. A first separation layer S1 is disposed between the first reference layers R1 and the first free layers F1.

A plurality of third reference layers R3 are disposed above the plurality of second reference layer R2 to be spaced apart from one another and in the form of wires to be parallel or substantially parallel to one another. Each of the third reference layers R3 include fifth and sixth magnetic domains D5 and D6 and a third magnetic domain wall DW3 between the fifth and sixth magnetic domains D5 and D6. The second reference layers R2 and the third reference layers R3 intersect (e.g., orthogonally intersect) one another. A plurality of second memory structures M2 are disposed at points or areas where the second and third reference layers R2 and R3 intersect one another, respectively. Each of the second memory structures M2 has a structure in which a second free layer F2 and a second switching element SW2 are stacked sequentially. A second separation layer S2 is disposed between the second reference layers R2 and the second free layers F2. Reference numeral S3 denotes a third separation layer that is disposed on each third reference layer R3, respectively. Although not shown in FIG. 9, a plurality of third memory structure may further be disposed on the third separation layers S3.

In FIG. 9, the third reference layers R3 may be replaced with electrodes, such as the electrodes W1 of FIG. 8, which extend in the X-axis direction. In this case, the third separation layers S3 may be omitted.

Figure 10:
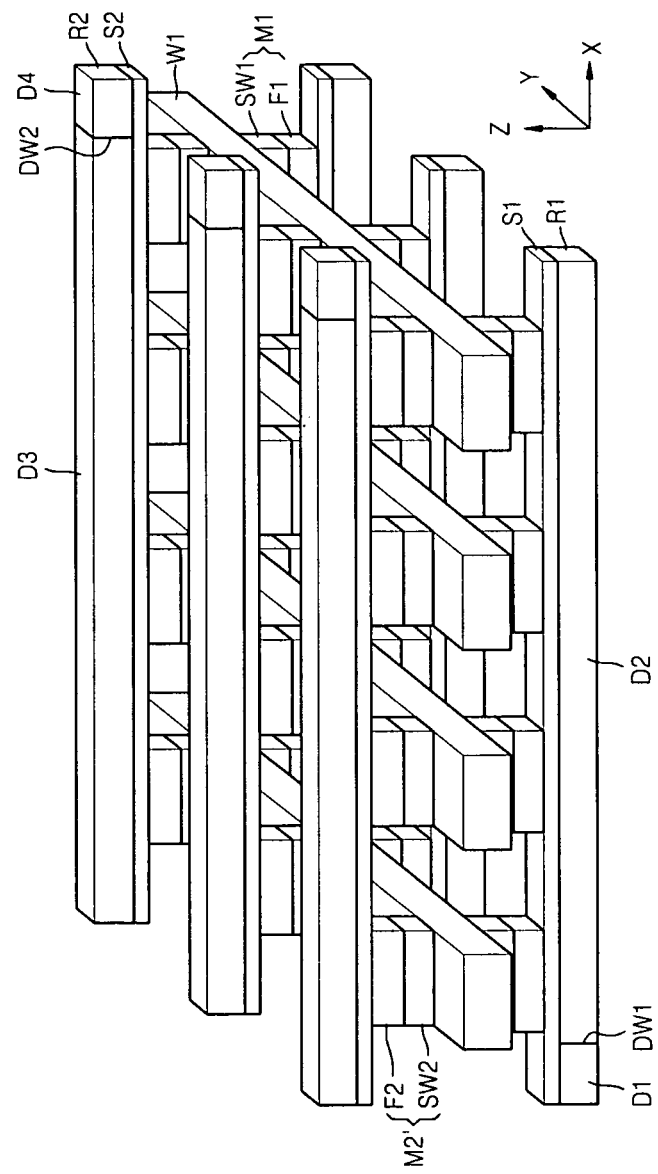

FIG. 10 illustrates a magnetic memory device having an array structure according to another example embodiment. The magnetic memory device of FIG. 10 is similar to the magnetic memory device of FIG. 8 in terms of basic structure, and thus, will be described by focusing on the differences between the magnetic memory devices of FIGS. 8 and 10.

Referring to FIG. 10, a plurality of second reference layers R2 are disposed above a plurality of electrodes W1 to be spaced apart from one another and in the form of wires to be parallel or substantially parallel to one another. Each of the second reference layers R2 includes third and fourth magnetic domains D3 and D4 and a second magnetic domain wall DW2 between the third and fourth magnetic domains D3 and D4. The electrodes W1 and the second reference layers R2 intersect (e.g., orthogonally intersect) one another. A plurality of second memory structures M2' are disposed at points or areas where the electrodes W1 and the second reference layers R2 intersect one another, respectively. Each of the second memory structures M2' has a structure in which a second switching element SW2 and a second free layer F2 are stacked sequentially. A second separation layer S2 is disposed between the second reference layers R2 and the second free layers F2. In the magnetic memory device of FIG. 10, the first and second memory structures M1 and M2' may be symmetrical or substantially symmetrical with respect to the corresponding electrode W1 in the vertical direction. In this case, the write/erase operation may be simultaneously or concurrently performed on the first and second memory structures M1 and M2' by using the electrode W1 as a common bit line.

In addition to the array structures of the magnetic memory devices of FIGS. 9 and 10, the magnetic memory device of FIG. 8 may be modified in various other ways. For example, the magnetic memory device of FIG. 8 may be stacked as a unit array structure several times in the Z-axis direction. In this case, an insulating layer may be interposed between the unit array structures (wherein each of the unit array structures is the same as illustrated in FIG. 8).

Methods of operating the magnetic memory devices of FIGS. 6 and 8 to 10 are similar to or the same as methods described above with reference to FIGS. 2A to 2D, 4A to 4E, and 5A to 5E, and thus, will not be described again here.

Figure 11:
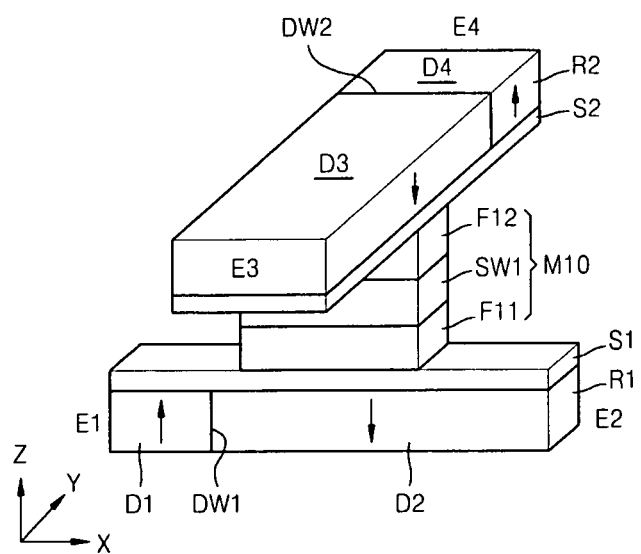
FIG. 11 is a perspective view of a basic structure of a magnetic memory device according to another example embodiment.

FIG. 11 is a perspective view of a basic structure of a magnetic memory device according to another example embodiment.

Referring to FIG. 11, a first reference layer R1 is arranged in the form of a wire and includes a first magnetic domain wall DW1 between first and second magnetic domains D1 and D2. A second reference layer R2 is disposed in the form of a wire above the first reference layer R1 and includes a second magnetic domain wall DW1 between third and fourth magnetic domains D3 and D4. The first and second reference layers R1 and R2 extend in the X-axis direction and in the Y-axis direction, respectively, and thus intersect each other orthogonally, but example embodiments are not limited thereto. That is, directions in which the first and second reference layers R1 and R2 extend are not limited. The first and second reference layers R1 and R2 may be formed of the same or substantially the same material as the reference layer R1 of FIG. 1.

A first memory structure M10 is disposed between the first and second reference layers R1 and R2. The first memory structure M10 includes at least two layers (e.g., first and second free layers F11 and F12) as information storage elements. The first memory structure M10 further includes a switching element SW1. More specifically, for example, the first memory structure M10 includes the first free layer F11 adjacent to the first reference layer R1, the second free layer F12 adjacent to the second reference layer R2, and a switching element SW1 between the first and second free layers F11 and F12. The first and second free layers F11 and F12 may be formed of the same or substantially the same material as the free layer F1 of FIG. 1. The switching element SW1 may be a one-way switching element. For example, the switching element SW1 may be a diode or other one-way switching element. A first separation layer S1 is disposed between the first reference layer R1 and the first free layer F11, and a second separation layer S2 is disposed between the second reference layer R2 and the second free layer F12. The first and second separation layers S1 and S2 may be formed of the same or substantially the same material as the separation layer S1 of FIG. 1. The thicknesses of the first and second separation layers S1 and S2 may be the same or different from each other.

In FIG. 11, a stacked structure of the first reference layer R1, the first separation layer S1, and the first free layer F11 may be the same or substantially the same as the stacked structure of FIG. 1, and a stacked structure of the second free layer F12, the second separation layer S2, and the second reference layer R2 may be a reverse structure of the stacked structure shown in FIG. 1. Thus, the magnetic memory device of FIG. 11 may be considered a combination of the structure of FIG. 1 and the reverse structure thereof, in which the switching element SW1 is disposed between the structure of FIG. 1 and the reverse structure thereof.

In FIG. 11, reference numerals E1 and E2 denote respective ends of the first reference layer R1. Reference numerals E3 and E4 denote respective ends of the second reference layer R2. The end E1 of the first reference layer R1 belongs to the first magnetic domain D1 and the other end E2 of the first reference layer R1 belongs to the second magnetic domain D2. The end E3 of the second reference layer R2 belongs to the third magnetic domain D3 and the other end E4 of the second reference layer R2 belongs to the fourth magnetic domain D4. Hereinafter, the ends E1 and E2 of the first reference layer R1 are referred to as a 'first end E1' and a 'second end E2', respectively, and the ends E3 and E4 of the second reference layer R2 are referred to as a 'third end E3' and a 'fourth end E4', respectively.

The magnetic memory device of FIG. 11 may have, for example, four states as illustrated in FIGS. 12A to 12D.

Figure 12A:
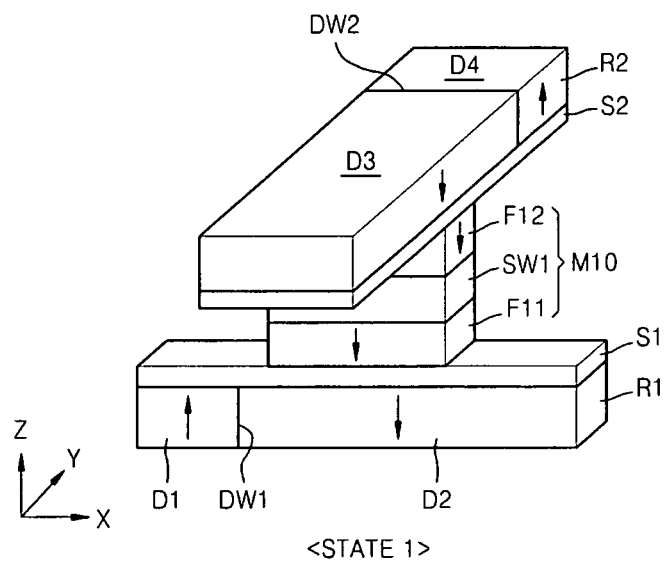
FIGS. 12A to 12D are perspective views illustrating four states that the magnetic memory device of FIG. 11 may have according to example embodiments.

Referring to FIG. 12A, the first free layer F11 and a region of the first reference layer R1 that corresponds to the first free layer F11 (e.g., the second magnetic domain D2) are magnetized in the same direction (e.g., in a direction opposite to the Z-axis direction) and the second free layer F12 and a region of the second reference layer R2 that corresponds to the second free layer F12 (e.g., the third magnetic domain D3) are also magnetized in the same direction (e.g., the direction opposite to the Z-axis direction). Thus, the first reference layer R1 and the first free layer F11 are in a parallel state, and the second free layer F12 and the second reference layer R2 are also in a parallel state. If the first reference layer R1, the first free layer F11, and the first separation layer S1 there between form a first magneto-resistive element together, then the first magneto-resistive element is in a low-resistance state. Similarly, if the second reference layer R2, the second free layer F12, and the second separation layer S2 there between form a second magneto-resistive element together, then the second magneto-resistive element is also in a low-resistance state. Such a state of the magnetic memory device of FIG. 12A is referred to as a "first state <State 1>".

Figure 12B:
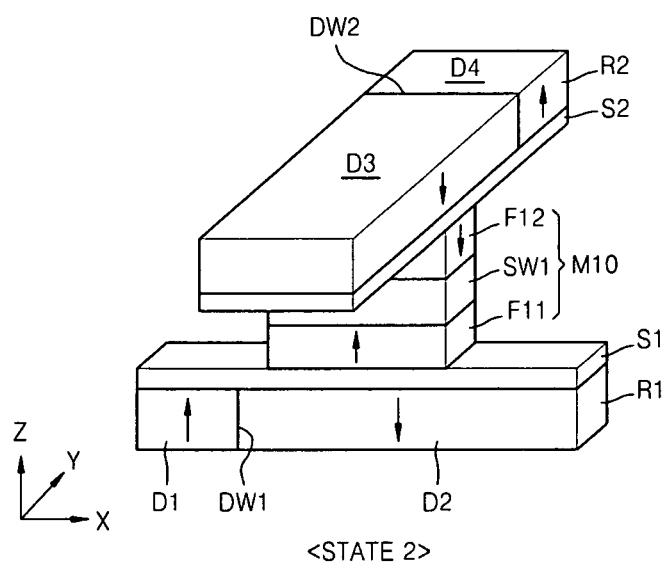

Referring to FIG. 12B, the first free layer F11 and the region of the first reference layer R1 that corresponds to the first free layer F11 (e.g., the second magnetic domain D2) are magnetized in different directions, whereas the second free layer F12 and the region of the second reference layer R2 that corresponds to the second free layer F12 (e.g., the third magnetic domain D3) are magnetized in the same direction. Thus, the first reference layer R1 and the first free layer F11 are in an anti-parallel state and the second free layer F12, whereas the second reference layer R2 are in a parallel state. In this case, the first magneto-resistive element is in a high-resistance state and the second magneto-resistive element is in the low-resistance state. Such a state of the magnetic memory device of FIG. 12B is referred to as a "second state <State 2>".

Figure 12C:
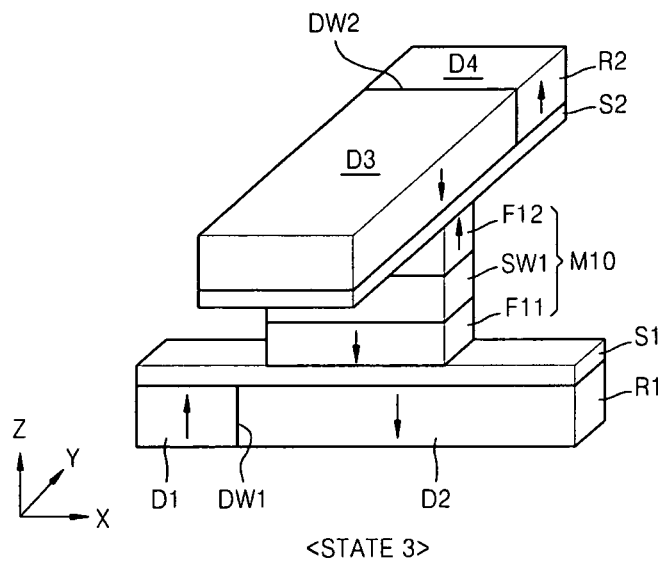

Referring to FIG. 12C, the first free layer F11 and the region of the first reference layer R1 that corresponds to the first free layer F11 (e.g., the second magnetic domain D2) are magnetized in the same direction, whereas the second free layer F12 and the region of the second reference layer R2 that corresponds to the second free layer F12 (e.g., the third magnetic domain D3) are magnetized in different directions. Thus, the first reference layer R1 and the first free layer F11 are in a parallel state, whereas the second free layer F12 and the second reference layer R2 are in an anti-parallel state. In this case, the first magneto-resistive element is in the low-resistance state, whereas the second magneto-resistive element is in the high-resistance state. Such a state of the magnetic memory device of FIG. 12C is referred to as a "third state <State 3>".

Figure 12D:
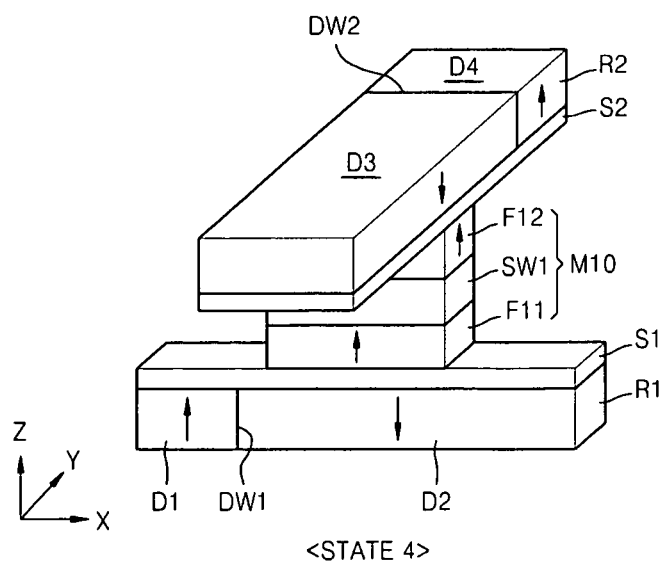

Referring to FIG. 12D, the first free layer F11 and the region of the first reference layer R1 that corresponds to the first free layer F11 (e.g., the second magnetic domain D2) are magnetized in different directions, and the second free layer F12 and the region of the second reference layer R2 that corresponds to the second free layer F12 (e.g., the third magnetic domain D3) are also magnetized in different directions. Thus, the first reference layer R1 and the first free layer F11 are in an anti-parallel state and the second free layer F12 and the second reference layer R2 are in an anti-parallel state. In this case, both the first and second magneto-resistive elements are in the high-resistance state. Such a state of the magnetic memory device of FIG. 12D is referred to as a "fourth state <State 4>".

If resistance values of the magnetic memory device of FIG. 11 in the first to fourth states <State 1 to State 4> as illustrated in FIGS. 12A to 12D, respectively, are first to fourth resistance values, then the first resistance value is the lowest value and the fourth resistance value is the highest value from among the first to fourth resistance values. The second and third resistance values are intermediate values between the first and fourth resistance values. The second and third resistance values may be the same or different from each other. If the thicknesses of the first and second separation layers S1 and S2 are different from each other, the second and third resistance values of the magnetic memory device in the second state <State 2> and the third state <State 3>, may be different. If the thicknesses of the first and second separation layers S1 and S2 are the same, the second and third resistance values are the same.

If the thicknesses of the first and second separation layers S1 and S2 are different from each other, then the resistance values of the first magneto-resistive element (the first reference layer/the first separation layer/the first free layer) and the second magneto-resistive element (the second reference layer/the second separation layer/the second free layer) are different from each other when the first and second magneto-resistive elements have the same magnetization condition (e.g., the parallel state or the anti-parallel state). For example, if both the first and second magneto-resistive elements are in the parallel state or the anti-parallel state, then the resistance values thereof may be different from each other. Thus, the resistance value of the magnetic memory device in the second state <State 2> illustrated in FIG. 12B may be different from that of the magnetic memory device in the third state <State 3> illustrated in FIG. 12C. If the thicknesses of the first and second separation layers S1 and S2 are the same, then the first and second magneto-resistive elements may be the same resistance values when the first and second magneto-resistive elements have the same magnetization condition (e.g., the parallel state or the anti-parallel state). Thus, the resistance values of the magnetic memory device in the second state <State 2> illustrated in FIG. 12B may be the same or substantially the same as that of the magnetic memory device in the third state <State 3> illustrated in FIG. 12C.

Accordingly, if the thicknesses of the first and second separation layers S1 and S2 are different from each other, then the magnetic memory device of FIG. 11 may have four different resistance states. If the thicknesses of the first and second separation layers S1 and S2 are the same, then the magnetic memory device of FIG. 11 may have three different resistance states. As described above, according to at least some example embodiments, a memory device, in which information may be stored according to three or more multi-states, may be manufactured.

Figure 13A:
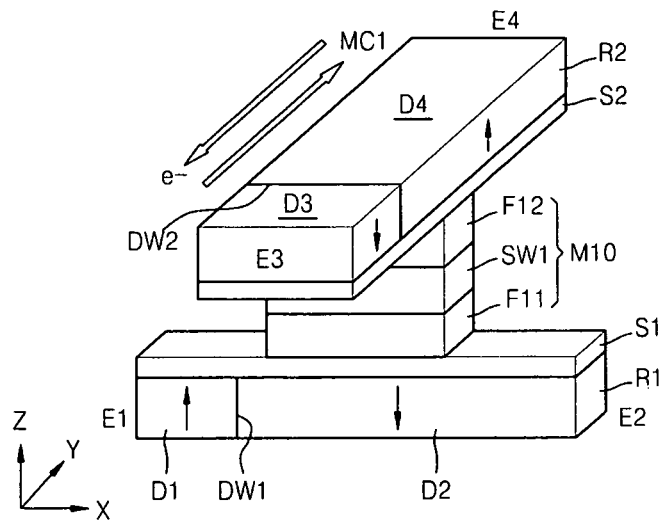
FIGS. 13A to 16 are perspective views illustrating methods of operating the magnetic memory device of FIG. 11 according to example embodiments.
Figure 13B:
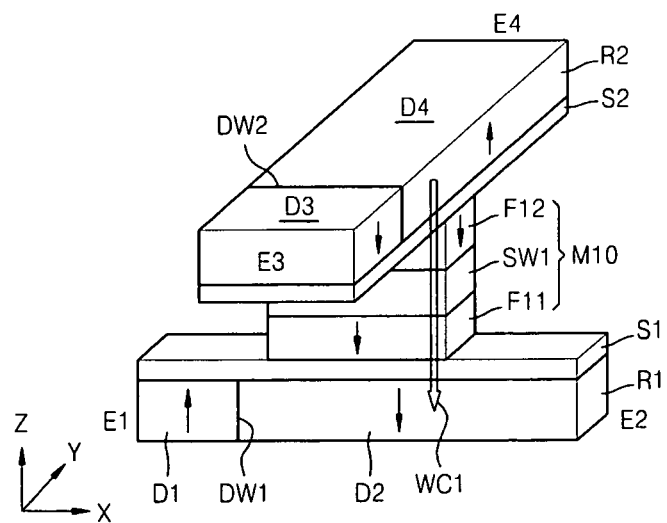
Figure 13C:
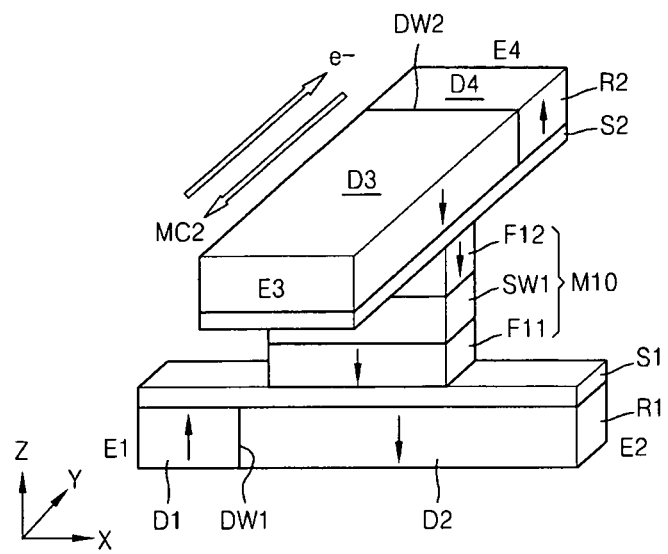

FIGS. 13A to 13C are perspective views illustrating a method of performing a write operation on the magnetic memory device of FIG. 11 according to an example embodiment. The method of FIGS. 13A to 13C may be considered as a method of deriving or obtaining the first state <State 1> illustrated in FIG. 12A.

Referring to FIG. 13A, the second magnetic domain wall DW1 is moved adjacent to the third end E3 by supplying a first movement current MC1 to the second reference layer R2.

Referring to FIG. 13B, a first write current WC1 is supplied from the second reference layer R2 to the first reference layer R1. The first write current WC1 is supplied from the fourth end E4 to the second end E2. The first write current WC1 allows electrons to move from the first reference layer R1 to the first memory structure M10 and finally to the second reference layer R2. If the electrons flow as described above, then the first free layer F11 is magnetized in a direction in which the second magnetic domain D2 is magnetized and the second free layer F12 is magnetized in a direction opposite to a direction in which the fourth magnetic domain D4 is magnetized. The principle that the first free layer F11 is magnetized in the direction in which the second magnetic domain D2 corresponding to the first free layer F11 is magnetized, is the same or substantially the same as the principle that the free layer F1 is magnetized in a direction in which the magnetic domain D1 or D2 corresponding to the free layer F1 is magnetized in FIGS. 2B and 2D.

An example reason why the second free layer F12 is magnetized in a direction opposite to the direction in which the fourth magnetic domain D4 corresponding to the second free layer F12 is magnetized, is that when electrons flow to the fourth magnetic domain D4 of the second reference layer R2 in response to the first write current WC1, electrons having the same spin direction as that of the fourth magnetic domain D4 may flow outside the fourth magnetic domain D4, but electrons having a spin direction opposite to that of the fourth magnetic domain D4 do not flow outside the fourth magnetic domain D4 and return back to the second free layer F12 thus applying spin torque to the second free layer F12. Thus, the second free layer F12 is magnetized in the direction opposite to the magnetization direction of the fourth magnetic domain D4 corresponding to the second free layer F12.

Referring to FIG. 13C, the second magnetic domain wall DW2 is moved adjacent to the fourth end E4 by supplying a second movement current MC2 to the second reference layer R2. The state of the magnetic memory device in FIG. 13C corresponds to the first state <State 1> of FIG. 12A. The operation illustrated in FIG. 13C is considered part of the write operation, but may also be considered as preliminary to the read operation.

Figure 14:
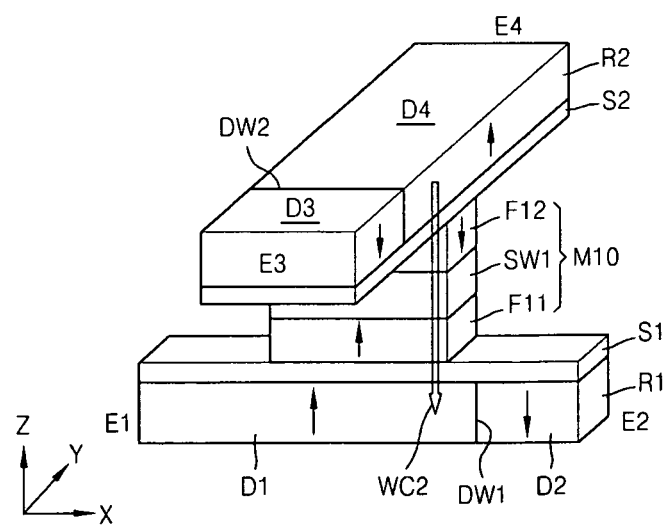
Figure 15:
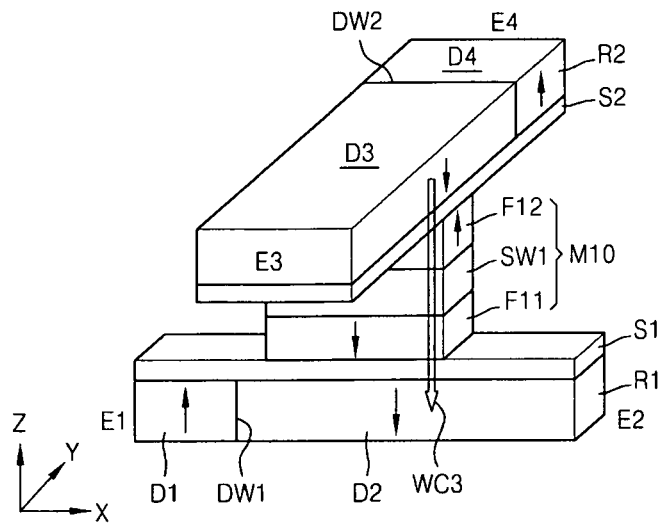
Figure 16:
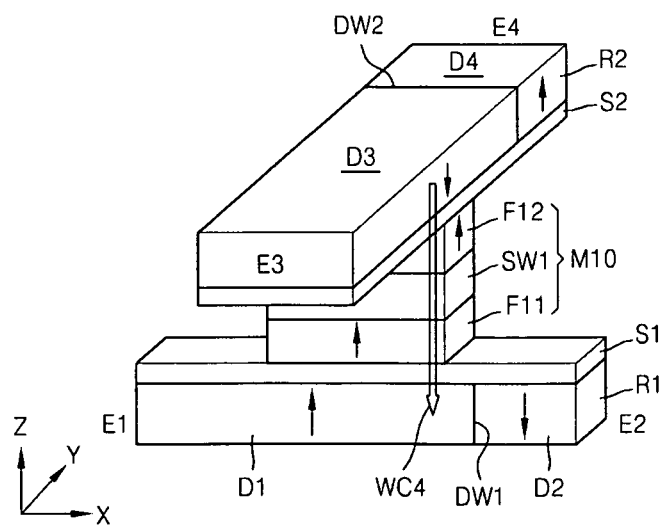

FIGS. 14 to 16 are perspective views illustrating methods of performing write operations on the magnetic memory device of FIG. 11 according to example embodiments. FIGS. 14, 15, and 16 may be considered part of the write operation in order to derive or obtain the second, third, and fourth states <State 2>, <State 3>, and <State 4> illustrated in FIGS. 12B, 12C, and 12D, respectively.

Referring to FIG. 14, after moving the first magnetic domain wall DW1 adjacent to the second end E2 and moving the second magnetic domain wall DW2 adjacent to the third end E3 in the structure of FIG. 1, a second write current WC2 is supplied from the second reference layer R2 to the first reference layer R1. Then, the first free layer F11 is magnetized in a direction of magnetization of the first magnetic domain D1 and the second free layer F12 is magnetized in a direction opposite to a direction of magnetization of the fourth magnetic domain D4. Thereafter, if the first magnetic domain wall DW1 is moved adjacent to the first end E1 and the second magnetic domain wall DW2 is moved adjacent to the fourth end E4, then the magnetic memory device is in the second state <State 2> of FIG. 12B.

Referring to FIG. 15, a third write current WC3 is supplied from the second reference layer R2 to the first reference layer R1 when the first and second magnetic domain walls DW1 and DW2 are located as illustrated in FIG. 11. Then, the first free layer F11 is magnetized in a direction of magnetization of the second magnetic domain D2 and the second free layer F12 is magnetized in a direction opposite to a direction of magnetization of the third magnetic domain D3. In this case, the state of the magnetic memory device corresponds to the third state <State 3> of FIG. 12C.

Referring to FIG. 16, after moving the first magnetic domain wall DW1 adjacent to the second end E2 in the structure of FIG. 1, a fourth write current WC4 is supplied from the second reference layer R2 to the first reference layer R1. Then, the first free layer F11 is magnetized in a direction of magnetization of the first magnetic domain D1 and the second free layer F12 is magnetized in a direction of a direction of magnetization of the third magnetic domain D3. Thereafter, if the first magnetic domain wall DW1 is moved adjacent to the first end E1, the state of the magnetic memory device corresponds to the fourth state <State 4> of FIG. 12D.

As described above with reference to FIGS. 13A to 16, according to at least this example embodiment, information to be written to the first memory structure M10 by supplying one of the first to fourth write currents WC1 to WC4 may vary depending on whether the first and second magnetic domain walls DW1 and DW2 of the respective first and second reference layers R1 and R2 are located at one side of the first memory structure M10 or another side of the first memory structure M10. In other words, information to be written to the first memory structure M10 may be determined according to a magnetic domain of the first reference layer R1 that corresponds to the first free layer F11 and a magnetic domain of the second reference layer R2 that corresponds to the second free layer F12. Thus, the write operation may be performed in association with movement of the first and/or second magnetic domain walls DW1 and DW2 within the first and/or second reference layers R1 and R2. Such a write operation may be considered as an erase operation.

In order to read written information, a given, desired or predetermined read current may be supplied from the second reference layer R2 to the first reference layer R1 illustrated in one of FIGS. 12A to 12D. The read current may be supplied from the third end E3 of the second reference layer R2 to the second end E2 of the first reference layer R1. Information written to the first memory structure M10 may be discriminated by a resistance value measured when the read current is supplied.

As described above, according to an example embodiment, the write operation, the read operation, and/or the erase operation may be performed by supplying current from the second reference layer R2 to the first reference layer R1. Accordingly, a one-way switching element may be used as the switching element SW1, and a magnetic memory device may operate in a relatively simple manner. The structure of the magnetic memory device may also be simplified.

Figure 17:
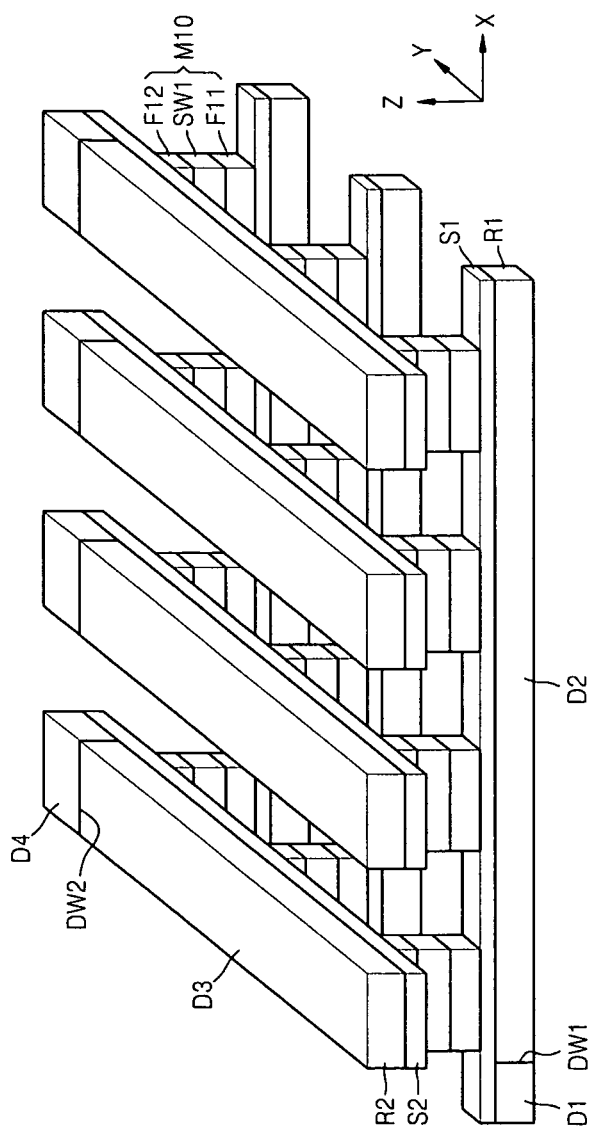
FIG. 17 is a perspective view illustrating a magnetic memory device having an array structure according to another example embodiment.

FIG. 17 is a perspective view illustrating a magnetic memory device having an array structure according to another example embodiment.

Referring to FIG. 17, a plurality of first reference layers R1 are disposed in the form of wires to be parallel or substantially parallel to one another. Each of the first reference layers R1 includes first and second magnetic domains D1 and D2, and a first magnetic domain wall DW1 between the first and second magnetic domains D1 and D2. A plurality of second reference layers R2 are disposed above the plurality of first reference layers R1 to be spaced apart from one another and in the form of wires to be parallel or substantially parallel to one another. Each of the second reference layer R2 may include third and fourth magnetic domains D3 and D4, and a second magnetic domain wall DW2 between the third and fourth magnetic domains D3 and D4. The first reference layers R1 and the second reference layers R2 may intersect (e.g., orthogonally intersect) one another. A plurality of first memory structures M10 are disposed at points or areas where the first and second reference layers R1 and R2 intersect one another, respectively. Each of the first memory structures M10 has a structure in which a first free layer F11, a first switching element SW1, and a second free layer F12 are stacked sequentially. A first separation layer S1 is disposed between the first reference layers R1 and the first free layers F11, and a second separation layer S2 is disposed between the second reference layers R2 and the second free layers F12.

Figure 18:
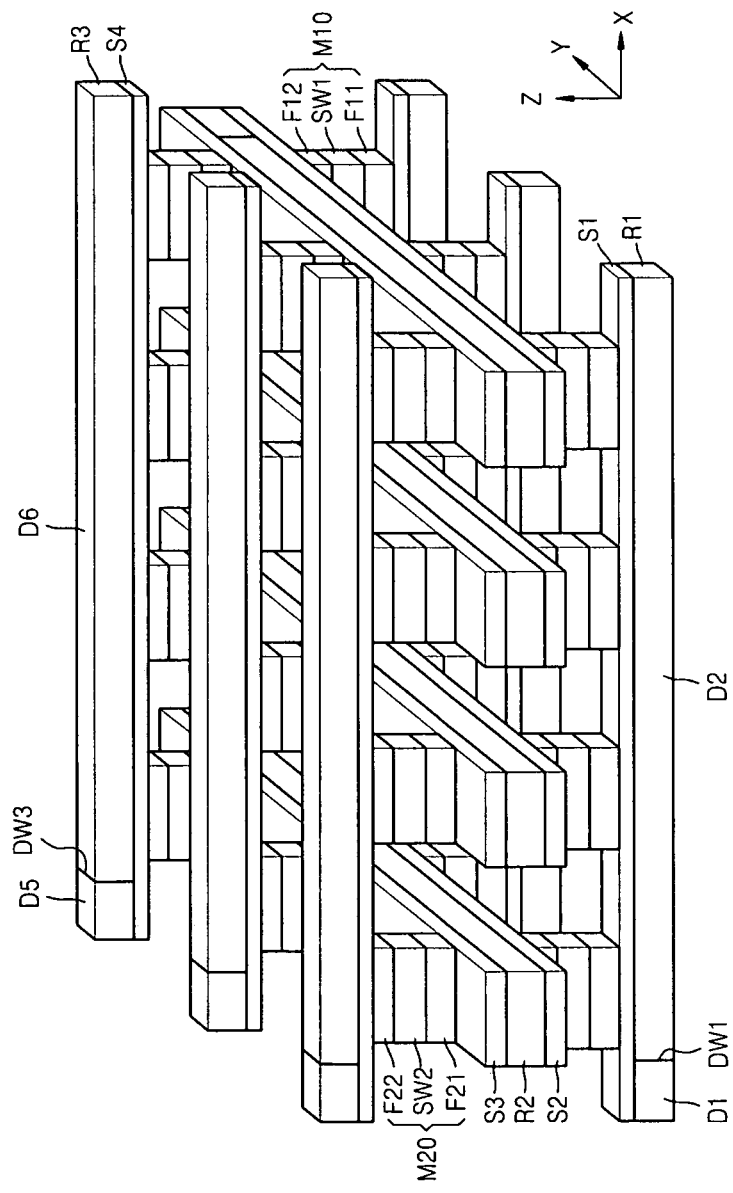
FIG. 18 is a perspective view illustrating a magnetic memory device having an array structure according to another example embodiment.

At least one set of an additional memory structure and an additional reference layer may be disposed on the magnetic memory device of FIG. 17, as illustrated in FIG. 18.

Referring to FIG. 18, a plurality of third reference layers R3 are disposed above a plurality of second reference layers R2 to be spaced apart from one another and in the form of wires to be parallel or substantially parallel to one another. Each of the third reference layers R3 includes fifth and sixth magnetic domains D5 and D6, and a third magnetic domain wall DW3 between the fifth and sixth magnetic domains D5 and D6. The second reference layers R2 and the third reference layers R3 intersect (e.g., orthogonally intersect) one another. A plurality of second memory structures M20 are disposed at points or areas where the second and third reference layers R2 and R3 intersect one another, respectively. Each of the second memory structures M20 has a structure in which a third free layer F21, a second switching element SW2 and a fourth free layer F22 are stacked sequentially. The second switching element SW2 may have the same switching direction as that of the first switching element SW1, or may have a switching direction opposite to that of the first switching element SW1. In the latter case, it is possible to simultaneously or concurrently write information to the first and second memory structures M10 and M20 by using the second reference layers R2 as common bit lines. A third separation layer S3 is disposed between the second reference layers R2 and the third free layers F21 and a fourth separation layer S4 is disposed between the third reference layers R3 and the fourth free layers F22.

Multi-layer cross point magnetic memory devices as illustrated in FIGS. 17 and 18 are advantageous in terms of their relatively high-degree integration. A relatively large-capacity memory device having a relatively high degree of integration may be manufactured by repeatedly stacking a structure in which wires (e.g., the first to third reference layers R1 to R3) are stacked to intersect one another and memory structures (i.e., the first and second M10 and M20) are disposed between the wires.

FIGS. 19A to 19D are perspective views illustrating a method of operating the magnetic memory device of FIG. 17 according to an example embodiment.

Figure 19A:
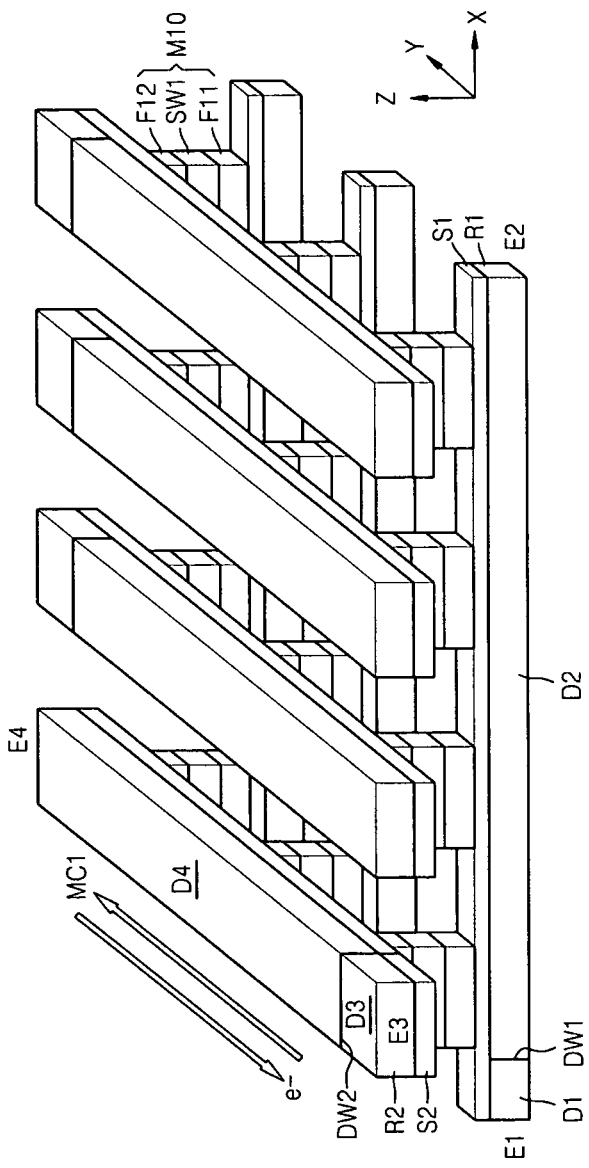

Referring to FIG. 19A, the second magnetic domain wall DW2 is moved adjacent to the third end E3 within at least one reference layer R2 (e.g., a leftmost second reference layer R2), which is selected from the plurality of second reference layers R2. That is, the fourth magnetic domain D4 expands within the selected second reference layer R2 to cover the plurality of first memory structures M10. In this example, reference numeral 'MC1' denotes a first movement current for moving the second magnetic domain wall DW2, and reference numeral 'e−' denotes electrons flowing through the selected second reference layer R2 when the first movement current MC1 is supplied.

Figure 19B:
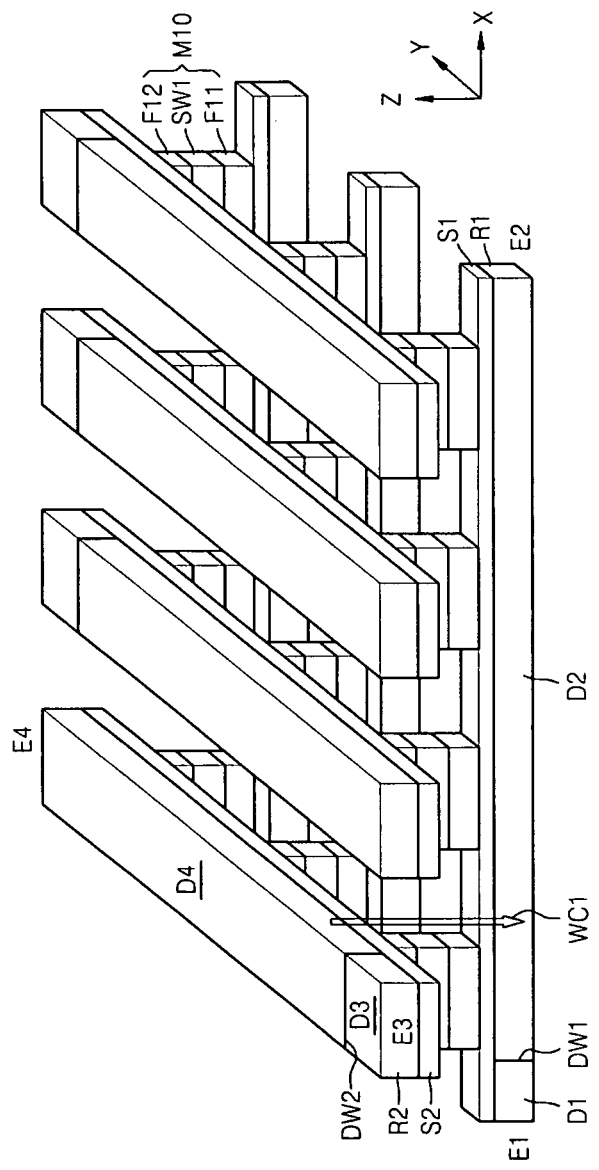

Referring to FIG. 19B, a first write current WC1 is supplied from the selected second reference layer R2 to at least one first reference layer R1 (e.g., a foremost first reference layer R1), which is selected from the plurality of first reference layers R1. The first write current WC1 flows through the first memory structure M10 between the selected first and second reference layers R1 and R2 (hereinafter, referred to as a 'selected first memory structure M10'), and directions of magnetization of the respective first and second free layers F11 and F12 are determined by the first write current WC1.

Figure 19C:
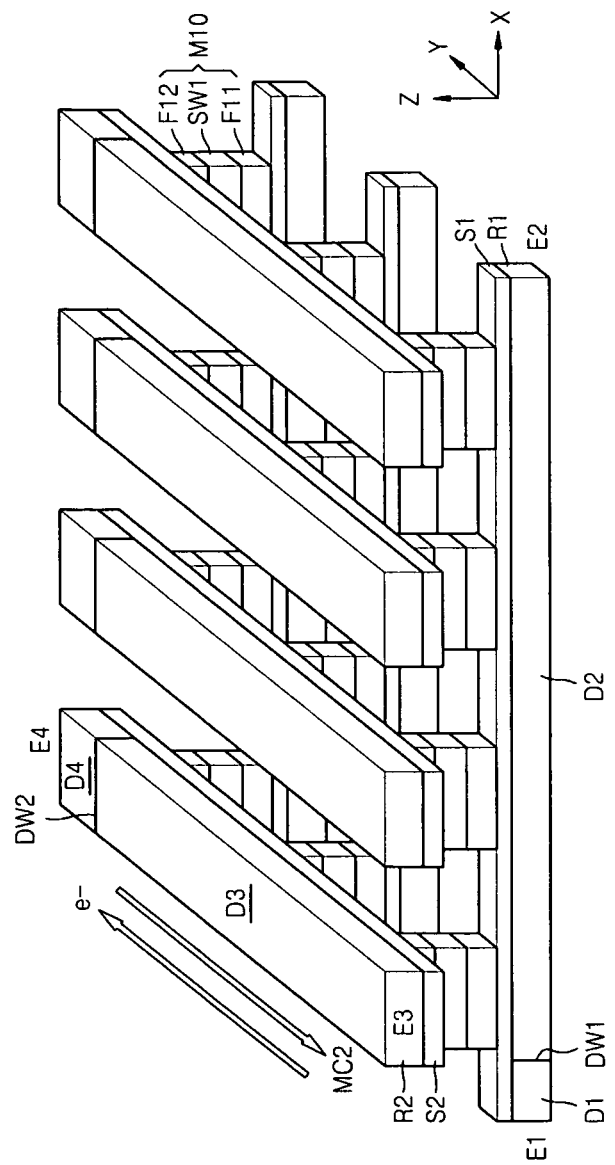

Referring to FIG. 19C, in the selected second reference layer R2, the second magnetic domain wall DW2 is moved adjacent to the fourth end E4. That is, the third magnetic domain D3 expands in the selected second reference layer R2 to cover the plurality of first memory structures M10. Reference numeral 'MC2' denotes a second movement current for moving the second magnetic domain wall DW2, and reference numeral 'e−' denotes electrons flowing through the selected second reference layer R2 when the second movement current MC2 is supplied. The operation of FIG. 19C is considered part of the write operation, but may be considered preliminary to the read operation.

If the operations of FIGS. 19A to 19C are performed, then information corresponding to the first state <State 1> of FIG. 12A may be written to the foremost and leftmost first memory structure (e.g., the selected first memory structure M10). The operations of FIGS. 19A to 19C may be similar or substantially similar to those of FIGS. 13A to 13C. Information corresponding to one of the second to fourth states <State 2> to <State 4> of FIGS. 12B to 12D may be written to the selected first memory structure M10. To this end, a write method as described above with reference to FIGS. 14 to 16 may be performed on the magnetic memory device of FIG. 17. Also, operations as described above with reference to FIGS. 4A to 4E and FIGS. 5A to 5E may be performed on the magnetic memory device of FIG. 17. Thus, information may be randomly or non-randomly written to, erased from and/or read from the plurality of first memory structures M10 of FIG. 17.

Information may be written to the selected first memory structure M1 by performing the operations of FIGS. 19A to 19C, and then a read current RC1 may be supplied to the selected first memory structure M10 as illustrated in FIG. 19D. The read current RC1 may be supplied from the selected second reference layer R2 to the selected first reference layer R1. Before and/or after the read operation is performed, the magnetic domain wall DW1 or DW2 may be moved within at least one reference layer selected from among the first and second reference layers R1 and R2 connected to the selected first memory structure M10. Also, before and/or after performing the erase operation, the magnetic domain wall DW1 or DW2 may be further moved within at least one reference layer selected from among the first and second reference layers R1 and R2 connected to the selected first memory structure M10.

As described above, according to one or more example embodiments, it is possible to manufacture a magnetic memory device having a relatively high-degree of integration, which may store information according to multi-states, and that is easier to operate.

It should be understood that the example embodiments described herein should be considered in a descriptive sense only and not for purposes of limitation. Descriptions of features or aspects within each example embodiment should typically be considered as available for other similar features or aspects in other example embodiments. For example, it would be apparent to those of ordinary skill in the relevant technical field that the magnetic memory devices of FIGS. 1, 3, 6, 8 to 11, 17, and 18 are only illustrative and magnetic memory devices may be embodied in various ways, and the methods of FIGS. 2A to 2D, 4A to 5E, 13A to 16, and 19A to 19D may be modified in various ways. For example, a write current, an erase current, and a read current may be supplied from the first reference layer R1 to the second reference layer R2. Also, an intermediate electrode may be disposed between a free layer and a switching element. Accordingly, the scope of example embodiments is not determined by the above example embodiments, but is determined by the technical idea disclosed in the claims and their equivalents.

What is claimed is:

1. A magnetic memory device comprising:
    a first reference layer in the form of a wire, the first reference layer including at least two first magnetic domains and a first magnetic domain wall between the at least two first magnetic domains;
    a second reference layer disposed as a wire and spaced apart from the first reference layer, the second reference layer including at least two second magnetic domains and a second magnetic domain wall between the at least two second magnetic domains; and
    a first memory structure disposed between the first and second reference layers, the first memory structure including at least two free layers as information storage elements.

2. The magnetic memory device of claim 1, wherein the first memory structure comprises:
    a first free layer disposed adjacent to the first reference layer;
    a second free layer disposed adjacent to the second reference layer; and
    a first switching element disposed between the first and second free layers.

3. The magnetic memory device of claim 2, further comprising:
    a first separation layer disposed between the first reference layer and the first free layer; and
    a second separation layer disposed between the second reference layer and the second free layer.

4. The magnetic memory device of claim 3, wherein thicknesses of the first and second separation layers are different.

5. The magnetic memory device of claim 3, wherein thicknesses of the first and second separation layers are the same.

6. The magnetic memory device of claim 2, wherein the first switching element is a one-way switching element.

7. The magnetic memory device of claim 1, wherein a plurality of the first reference layers are disposed in parallel, a plurality of the second reference layers are disposed in parallel to intersect the plurality of the first reference layers, and the first memory structure is disposed at each area where the first and second reference layers intersect one another.

8. The magnetic memory device of claim 7, further comprising:
    a plurality of third reference layers disposed above the plurality of second reference layers to intersect the plurality of second reference layers, each of the plurality of third reference layers including at least two third magnetic domains and a third magnetic domain wall between the at least two third magnetic domains; and
    a plurality of second memory structures disposed at areas where the second and third reference layers intersect one another, each of the plurality of second memory structures including at least two free layers as information storage elements.

9. The magnetic memory device of claim 8, wherein each of the plurality of second memory structures comprises:
    a third free layer disposed adjacent to the second reference layer;
    a fourth free layer disposed adjacent to the third reference layer; and
    a second switching element disposed between the third and fourth free layers.

10. A method of operating the magnetic memory device of claim 1, the method comprising:
    supplying a write current from one of the first and second reference layers to an other of the first and second reference layers through the first memory structure.

11. The method of claim 10, wherein information to be written to the first memory structure by the write current varies according to which of the at least two first magnetic domains and which of the at least two second magnetic domains corresponds to the first memory structure.

12. The method of claim 10, wherein at least one of before and after the supplying of the write current, the method further comprises:
    moving at least one of the first and second magnetic domain walls past a region on which the first memory structure is disposed.

13. The method of claim 10, further comprising:
    supplying a read current or an erase current from one of the first and second reference layers to an other of the first and second reference layers through the first memory structure.

14. The method of claim 13, wherein at least one of before and after the supplying the read current or the erase current, the method further comprises:
    moving at least one of the first and second magnetic domain walls past a region on which the first memory structure is disposed.

15. The method of claim 10, wherein the first memory structure comprises:
    a first free layer disposed adjacent to the first reference layer;
    a second free layer disposed adjacent to the second reference layer;
    a switching element disposed between the first and second free layers;
    a first separation layer disposed between the first reference layer and the first free layer; and
    a second separation layer disposed between the second reference layer and the second free layer; wherein thicknesses of the first and second separation layers are the same or different.

* * * * *

UNITED STATES PATENT AND TRADEMARK OFFICE
CERTIFICATE OF CORRECTION

| | |
|---|---|
| PATENT NO. | : 8,514,619 B2 |
| APPLICATION NO. | : 12/923129 |
| DATED | : August 20, 2013 |
| INVENTOR(S) | : In-jun Hwang |

It is certified that error appears in the above-identified patent and that said Letters Patent is hereby corrected as shown below:

On the Title Page

Item (75) Inventor should read: In-jun Hwang, Hwaseong-si (KR)

Signed and Sealed this
Twelfth Day of November, 2013

Teresa Stanek Rea
*Deputy Director of the United States Patent and Trademark Office*